United States Patent
Dai et al.

(10) Patent No.: US 11,349,082 B2
(45) Date of Patent: May 31, 2022

(54) COMPOUND, ORGANIC ELECTROLUMINESCENT DEVICE AND DISPLAY DEVICE

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Wenpeng Dai, Shanghai (CN); Jinghua Niu, Shanghai (CN); Wei Gao, Shanghai (CN); Lei Zhang, Shanghai (CN); Wenjing Xiao, Shanghai (CN)

(73) Assignees: Wuhan Tianma Micro-Electronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 332 days.

(21) Appl. No.: 16/731,076

(22) Filed: Dec. 31, 2019

(65) Prior Publication Data
US 2021/0098709 A1    Apr. 1, 2021

(30) Foreign Application Priority Data
Sep. 26, 2019   (CN) .................. 201910919200.X

(51) Int. Cl.
*H01L 51/50* (2006.01)
*H01L 51/00* (2006.01)
*C07F 9/6568* (2006.01)

(52) U.S. Cl.
CPC ...... *H01L 51/0071* (2013.01); *C07F 9/65685* (2013.01); *H01L 51/008* (2013.01);
(Continued)

(58) Field of Classification Search
None
See application file for complete search history.

(56) References Cited

FOREIGN PATENT DOCUMENTS

CN  110256495 A   9/2019
KR  2018-034925  * 4/2018  ............. H01L 51/50

* cited by examiner

*Primary Examiner* — Gregory D Clark
(74) *Attorney, Agent, or Firm* — Kilpatrick Townsend & Stockton LLP

(57) ABSTRACT

The present disclosure relates to a compound, an organic electroluminescent device, and a display device. The compound has a structure of formula (I)

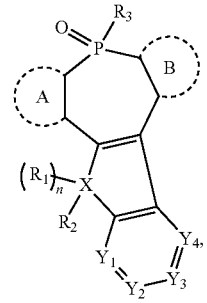

formula (I)

X is selected from a C atom, a Si atom, a B atom, or a P atom; $Y_1$ to $Y_4$ are each independently selected from a C atom or an N atom; A and B are each independently selected from any one or more of a substituted or unsubstituted C6-C40 aryl group and a substituted or unsubstituted C4-C40 heteroaryl group; $R_1$ is selected from carbonyl, C1-C9 alkyl, a substituted or unsubstituted C6-C18 aryl group, and a substituted or unsubstituted C4-C30 heteroaryl group; and $R_2$ and $R_3$ are each independently selected from any one of a C1-C9 alkyl group, a substituted or unsubstituted (Continued)

C6-C18 aryl group, and a substituted or unsubstituted C4-C30 heteroaryl group, and n is selected from 0 or 1.

12 Claims, 1 Drawing Sheet

(52) U.S. Cl.
CPC ...... *H01L 51/0094* (2013.01); *H01L 51/5072* (2013.01); *H01L 51/5096* (2013.01)

COMPOUND, ORGANIC ELECTROLUMINESCENT DEVICE AND DISPLAY DEVICE

CROSS-REFERENCE TO RELATED APPLICATION

This application claims priority to Chinese Patent Application No. 201910919200.X, filed on Sep. 26, 2019, which is hereby incorporated by reference in its entirety.

FIELD

The present disclosure relates to the field of organic electroluminescence technology, and in particular to a compound, an organic electroluminescent device, and a display device.

BACKGROUND

The electron transport material used in a conventional electroluminescent device is Alq3, but the electron mobility of Alq3 is relatively low (about $10^{-6}$ cm$^2$/Vs), and the electron transporting and hole transporting of the device are unbalanced. With the productization and practicality of the electroluminescent device, it is desirable to obtain an ETL material with higher transmission efficiency and better operational performance.

Currently the electron transport material that is more widely used, such as batho-phenanthroline (BPhen), batho-cuproine (BCP), and TmPyPB, can substantially meet the market demand of organic electroluminescence panels, but its glass transition temperature is low, generally less than 85° C., and during operation of the device, the Joule heat as generated will lead to molecular degradation and molecular structure changes, making the panel be less efficient and poorer in thermal stability. At the same time, this molecular structure symmetrization is very regular, which is easy to cause crystallization after a long time. Once the electron transport material crystallizes, the intermolecular charge transition mechanism will be different from the normally operated amorphous film mechanism, resulting in decreased performance of electron transporting, and the electron mobility and hole mobility of the entire device are unbalanced and the exciton formation efficiency is greatly reduced, and the exciton formation will be concentrated at the interface between the electron transport layer and a light emitting layer, resulting in a serious decrease in the efficiency and service life of the device.

Therefore, it has a very important practical application value to design and develop a stable and efficient electron transport material and/or electron injecting material able to simultaneously have a high electron mobility and a high glass transition temperature and effectively doped with a metal Yb or Liq$_3$, and reducing a threshold voltage, improving the efficiency of the device, and extending the service life of the device.

SUMMARY

The present disclosure provides a compound, an organic electroluminescent device including the compound, and a display device having the organic electroluminescent device.

According to an embodiment of the present disclosure, a compound having a structure of formula (I) is provided

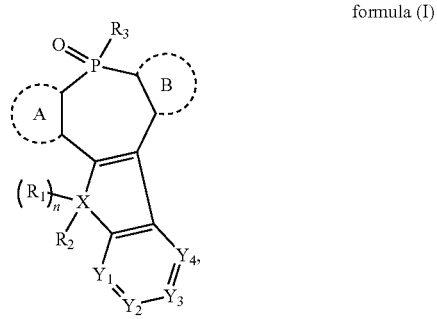

formula (I)

X is selected from a C atom, a Si atom, a B atom, or a P atom; $Y_1$ to $Y_4$ are each independently selected from a C atom, or an N atom; A and B are each independently selected from any one or more of a substituted or unsubstituted C6-C40 aryl group, and a substituted or unsubstituted C4-C40 heteroaryl group;

$R_1$ is selected from carbonyl, C1-C9 alkyl, a substituted or unsubstituted C6-C18 aryl group, and a substituted or unsubstituted C4-C30 heteroaryl group; and $R_2$ and $R_3$ are each independently selected from any one of a C1-C9 alkyl group, a substituted or unsubstituted C6-C18 aryl group, and a substituted or unsubstituted C4-C30 heteroaryl group, and n is selected from 0 or 1.

According to an embodiment of the present disclosure, the C6-C40 aryl group is selected from phenyl, naphthyl, and anthryl, and the C4-C40 heteroaryl group is selected from pyridyl, pyrrolyl, indolyl, pyrimidinyl, purinyl, quinolyl, isoquinolyl, furyl, and thienyl.

According to an embodiment of the present disclosure, the C6-C18 aryl group is selected from phenyl, naphthyl, and anthryl, and the C4-C30 heteroaryl group is selected from pyridyl, pyrrolyl, indolyl, pyrimidinyl, purinyl, quinolyl, isoquinolyl, thienyl, furyl, dibenzothiophenyl, and dibenzofuryl.

According to an embodiment of the present disclosure, in the substituted C6-C40 aryl group, the substituted C4-C40 heteroaryl group, the substituted C6-C18 aryl group, and the substituted C4-C30 heteroaryl group, the substituents are each independently selected from any one or more of a C1-C10 alkyl or cycloalkyl group, a C2-C10 alkenyl group, a C1-C6 alkoxy group, a C6-C30 monocyclic aromatic hydrocarbon or fused ring aromatic hydrocarbon group, and a C3-C30 monocyclic heteroaromatic hydrocarbon or fused ring heteroaromatic hydrocarbon group.

According to an embodiment of the present disclosure, $Y_1$ to $Y_4$ are all C atoms.

According to an embodiment of the present disclosure, at least one of $Y_1$ to $Y_4$ is an N atom.

According to an embodiment of the present disclosure, one or two of $Y_1$ to $Y_4$ are N atoms, and the rest of them are C atoms.

According to an embodiment of the present disclosure, the compound is selected from any one of
P01
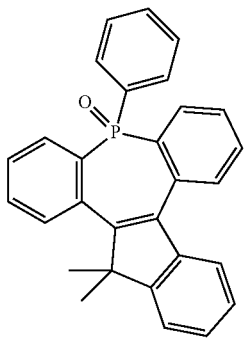
P02
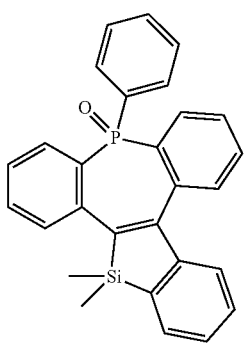
P03
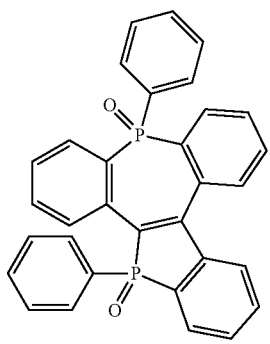
P04
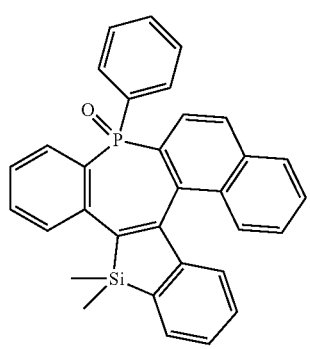
-continued
P05
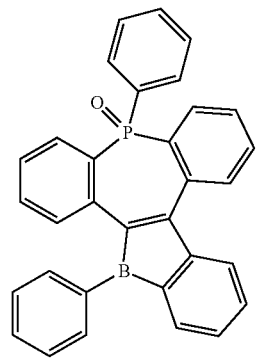
P06
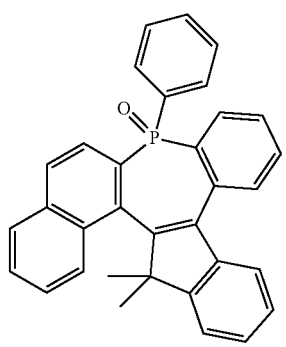
P07
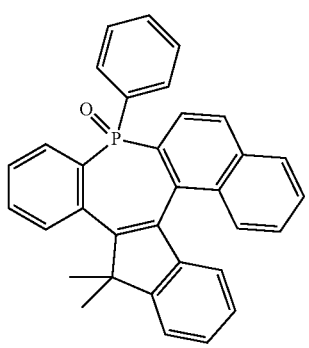
P08
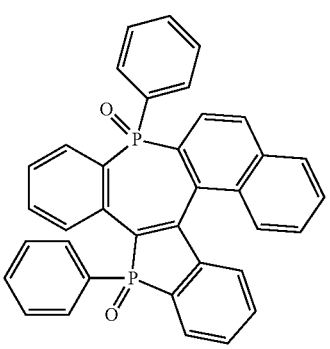

P09
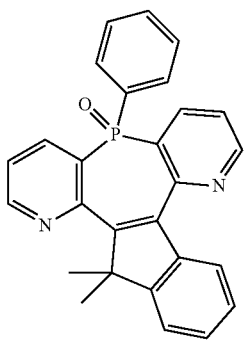
P10
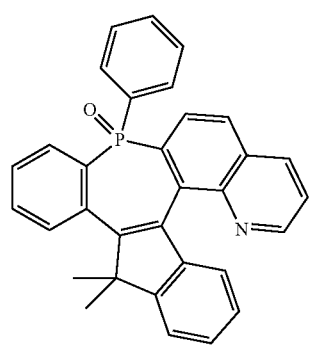
P11
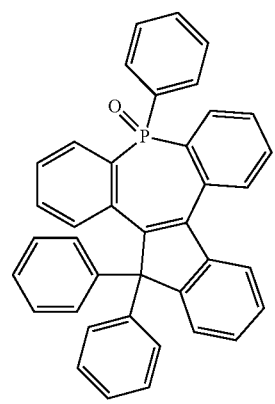
P12
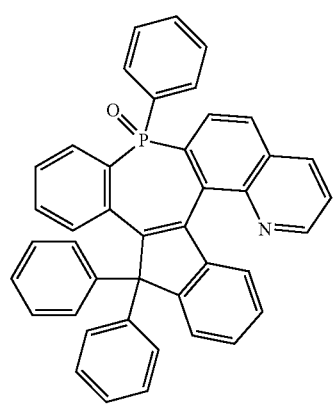
P13
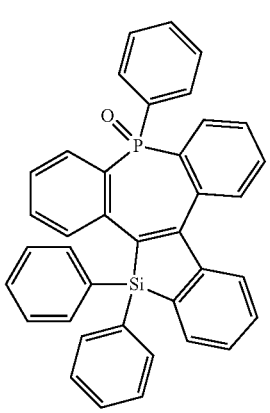
P14
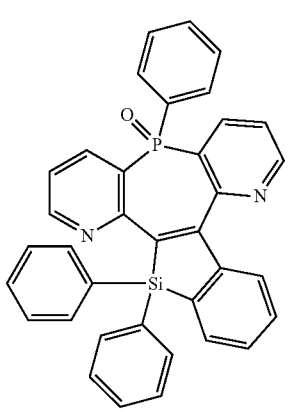
P15
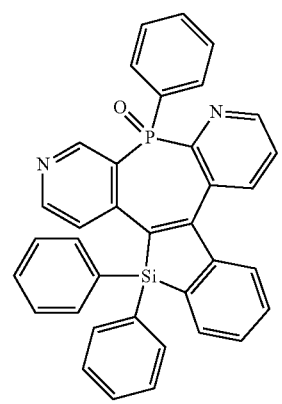
P16
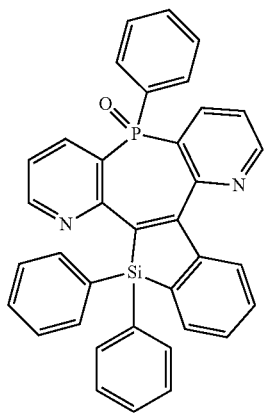

P17
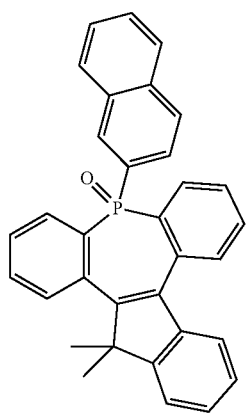
P18
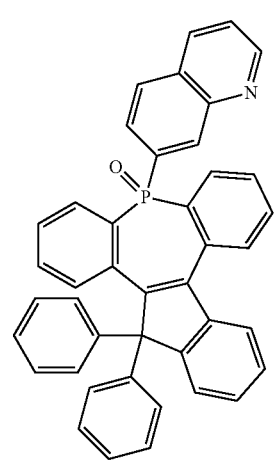
P19
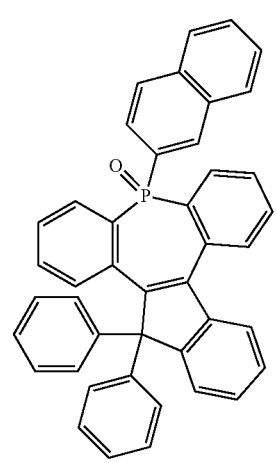
P20
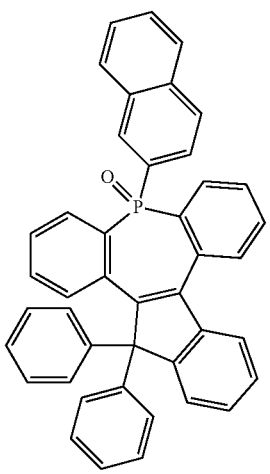
P21
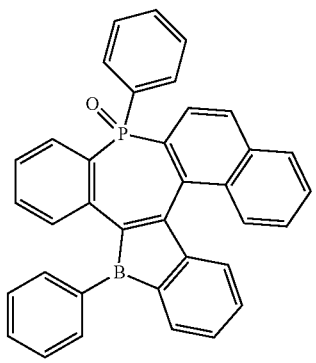
P22
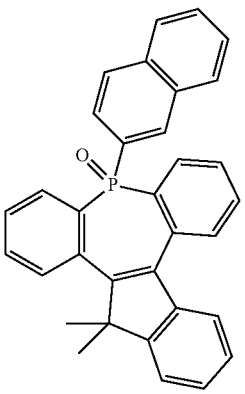
P23
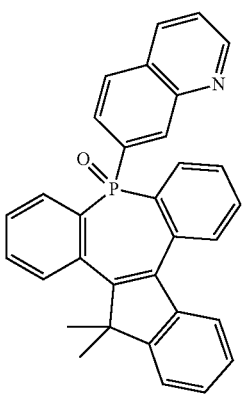

P24
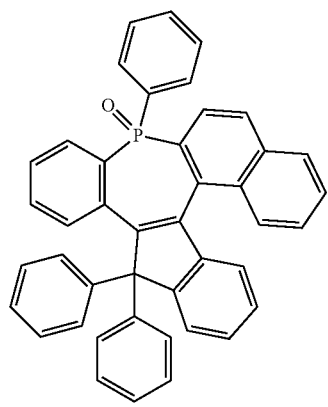
P25
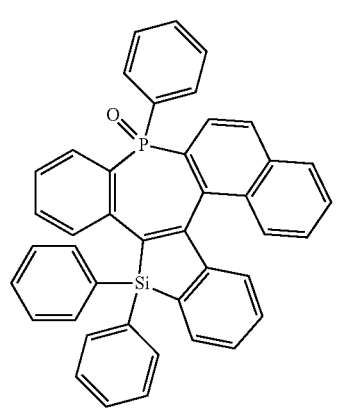
P26
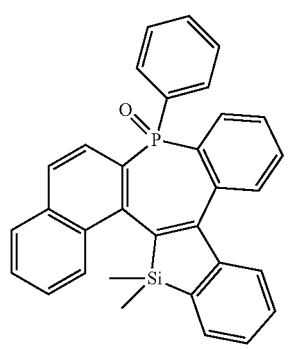
P27
P28
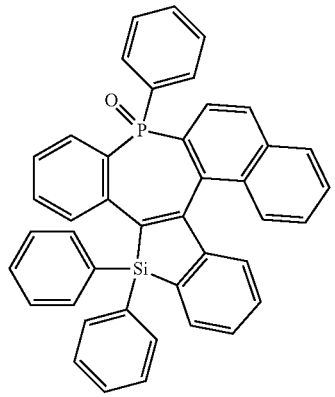
P29
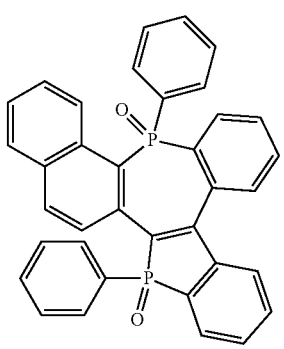
P30
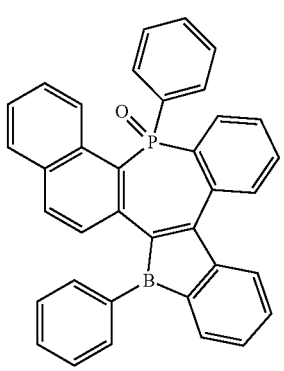
P31
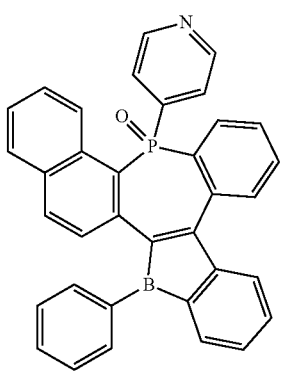

P32
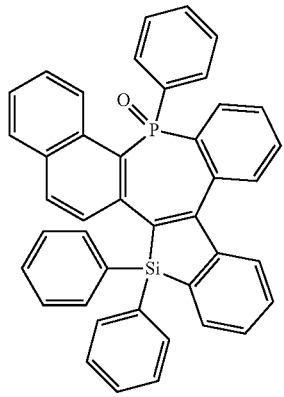
P33
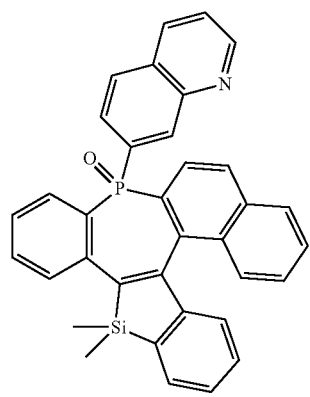
P34
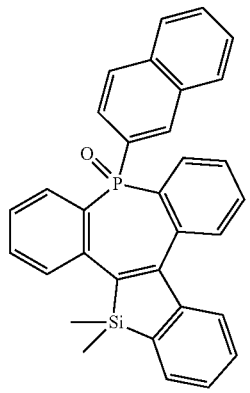
P35
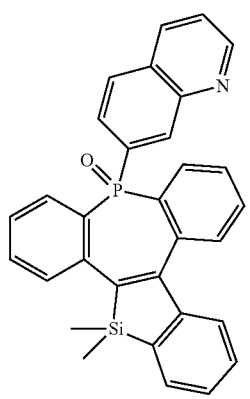
P36
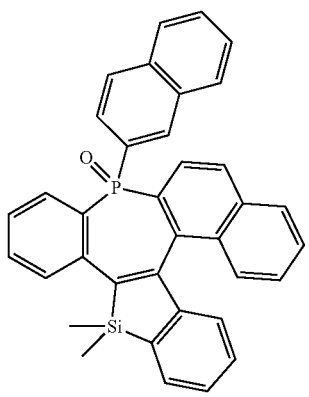
P37
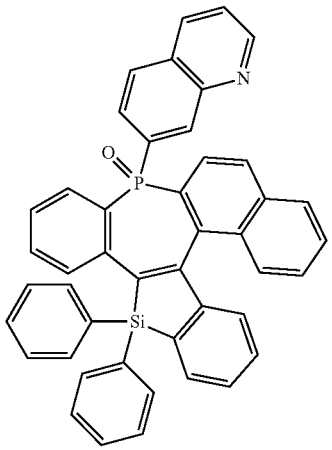
P38
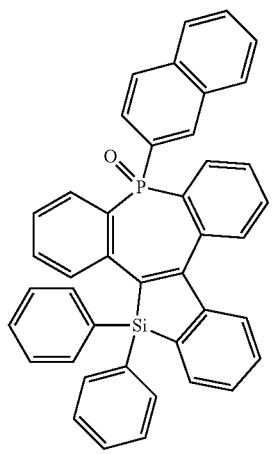

-continued
P39
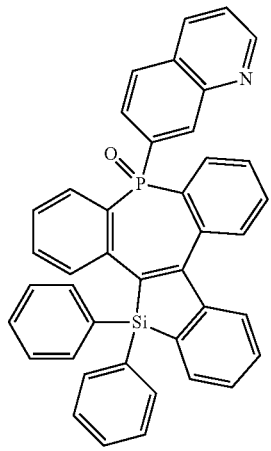
P40
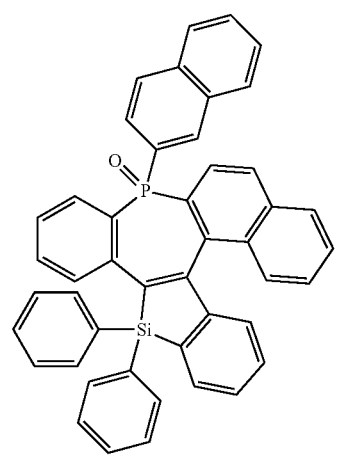
P41
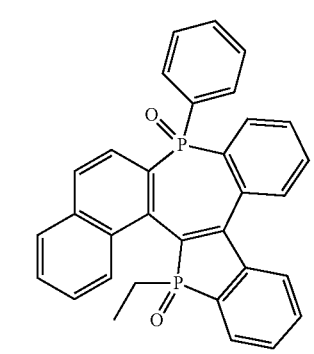
P42
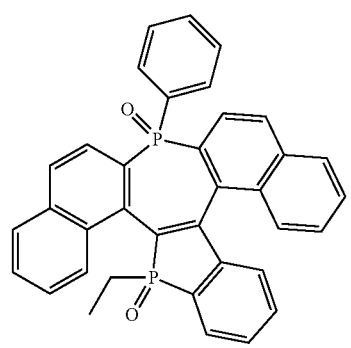
-continued
P43
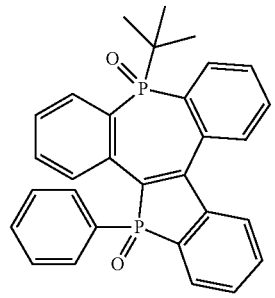
P44
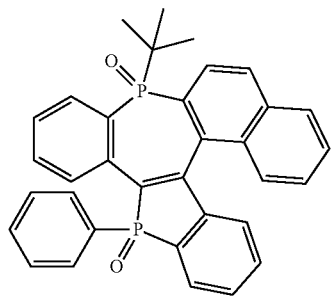
P45
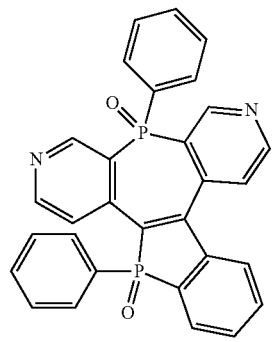
P46
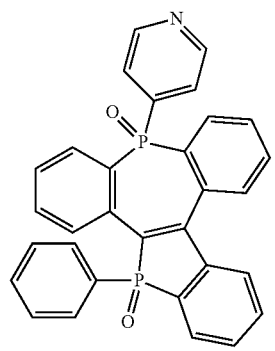
P47
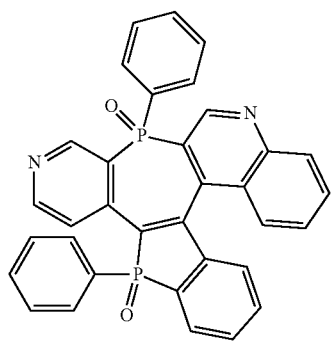

P48
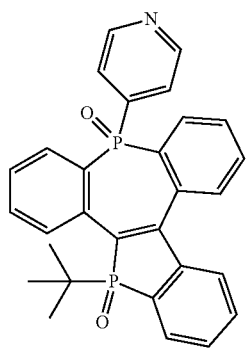
P49
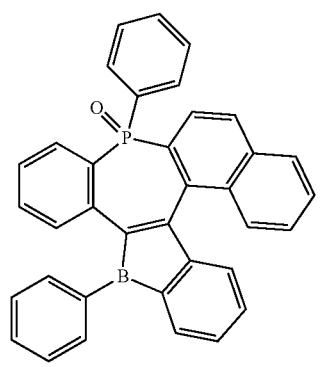
P50
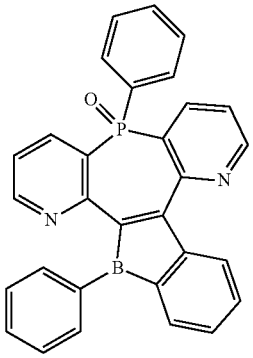
P52
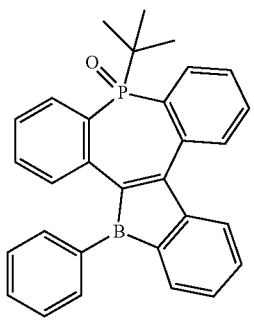
P53
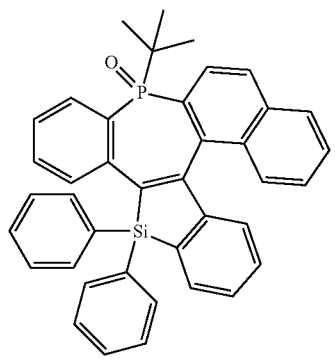
P54
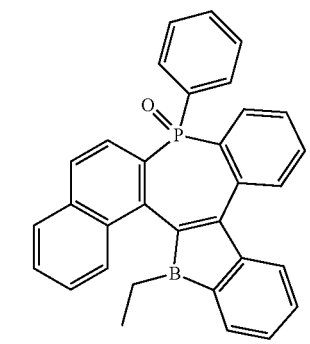
P55
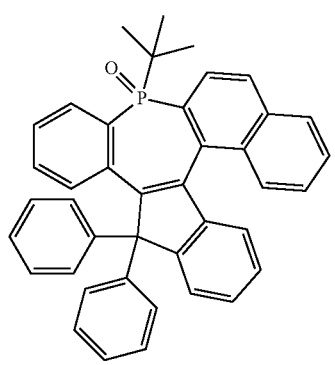
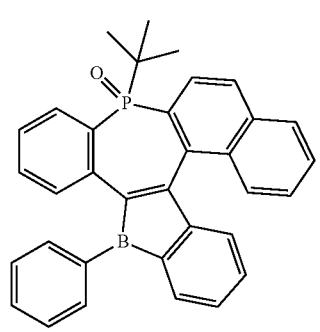

P56 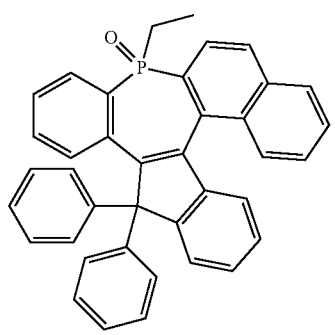
P57 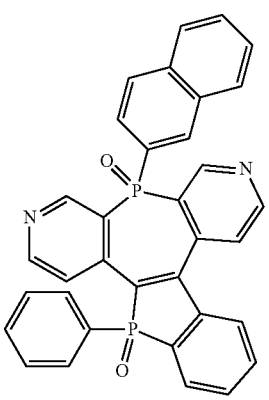
P58 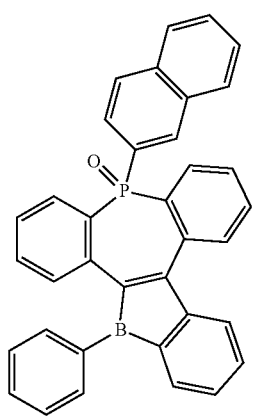
P59 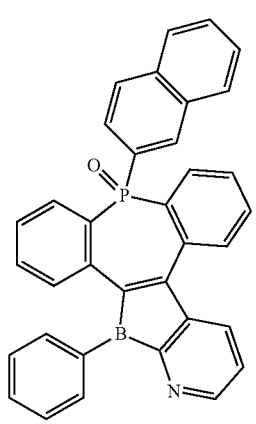
P60 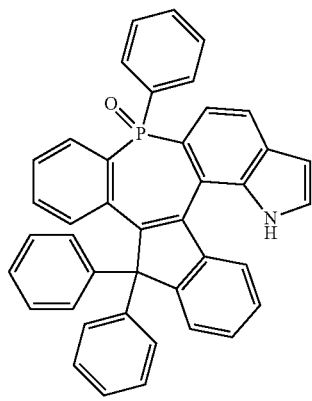
P61 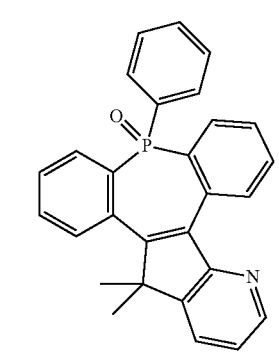
P62 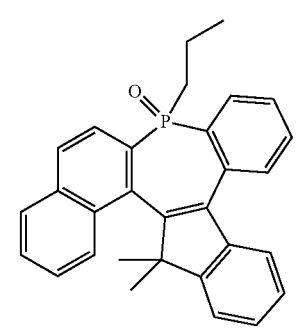
P63 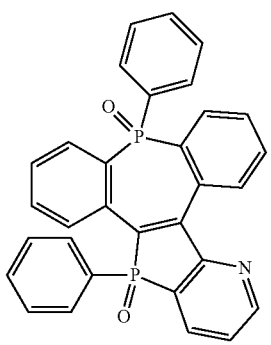

-continued
P64
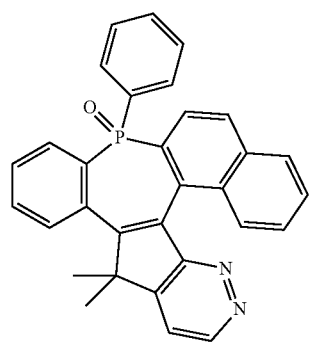
P65
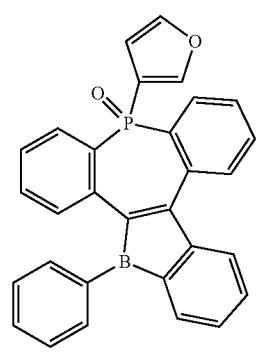
P66
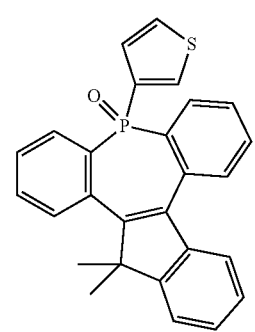
P67
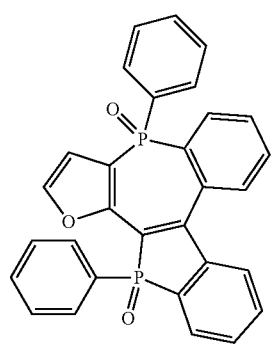
-continued
P68
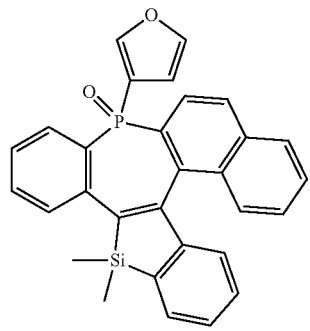
P69
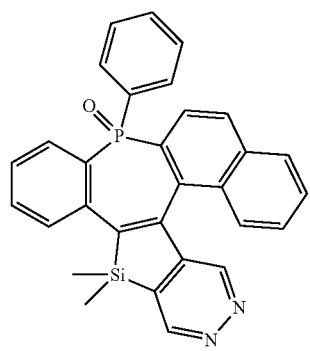
P70
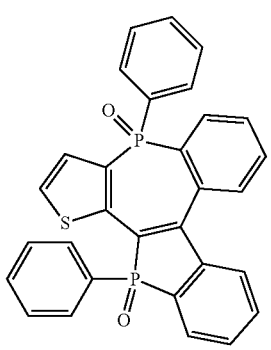
P71
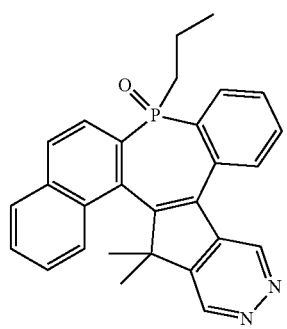

P72
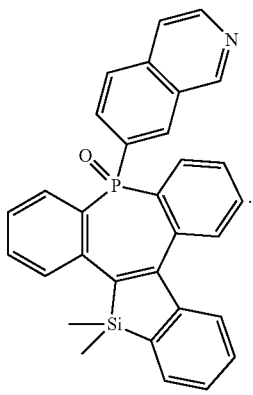
According to an embodiment of the present disclosure, the compound is selected from any one of
P01
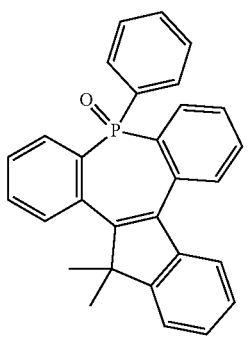
P02
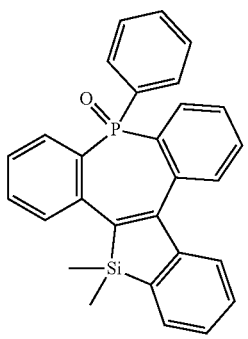
P03
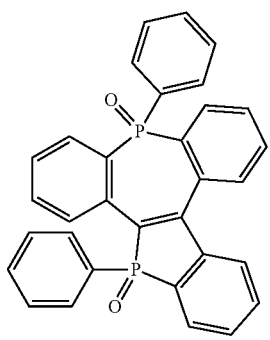
P05
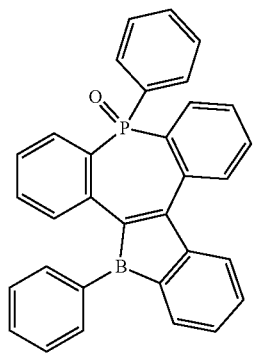
P07
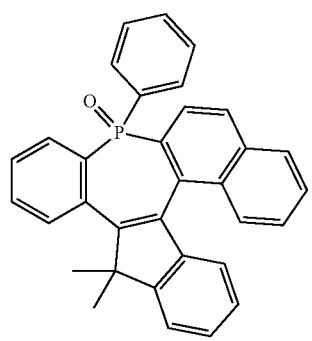
P09
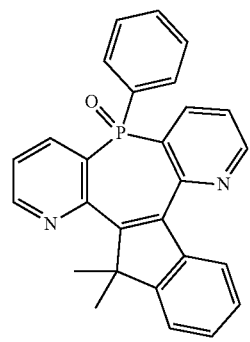
P11
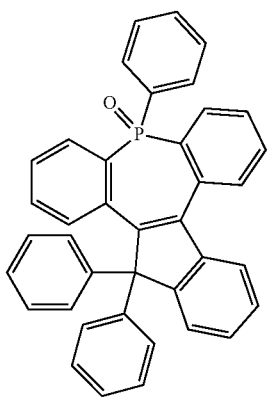

-continued

P59
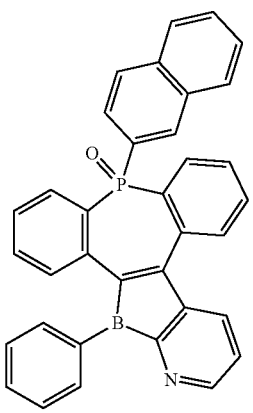

P65
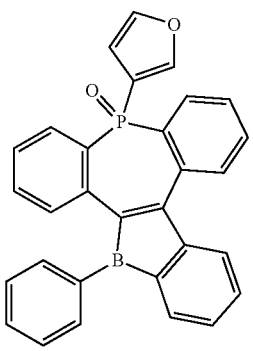

P70
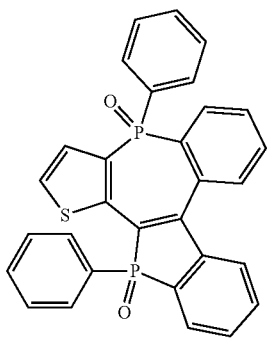

According to another embodiment of the present disclosure, provided is an organic electroluminescent device including a first electrode and a second electrode, and an organic functional layer located between the first electrode and the second electrode, the organic functional layer including an electron transport layer, and the electron transport material of the electron transport layer includes the compound according to the present disclosure.

According to an embodiment of the present disclosure, the organic functional layer further includes a hole blocking layer, and the transport material of the hole blocking layer includes the compound according to the present disclosure.

According to another embodiment of the present disclosure, provided is a display device including the organic electroluminescent device according to the present disclosure.

The beneficial effects of the present disclosure are as follows:

The compound of the present disclosure contains a cycloalkyl structure, and a sp3 hybridized carbon can break molecular conjugation and improve the triplet state energy level of the molecule; and the compound of the present disclosure also contains an alkyl structure and can improve the solubility of the molecule.

The compound of the present disclosure can be used as an electron transport material, has a proper HOMO value and a lower LUMO value, can improve the electron transporting capability and block holes effectively; and meanwhile, it has a higher triplet level $E_T$, a high electron mobility, excellent thermal stability and film stability, which is beneficial for improving the luminous efficiency. An OLED device which contains the compound of the present disclosure as the electron transport material has a lower driving voltage, as well as higher luminous efficiency and a longer service life.

Figure 1:
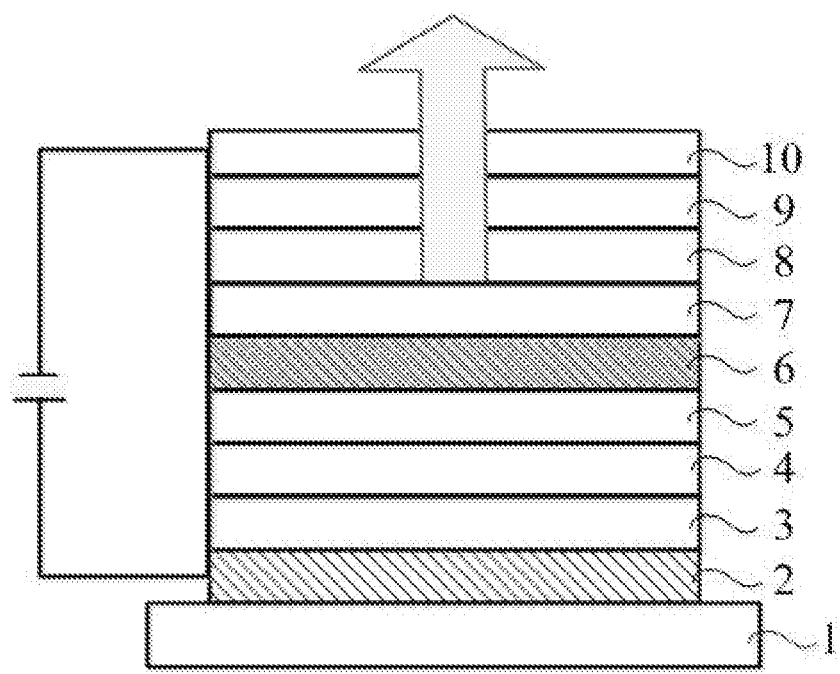
FIG. 1 is a schematic structural diagram of an organic electroluminescent device according to the present disclosure.

In one embodiment, 1—substrate, 2—ITO anode, 3—hole injection layer, 4—first hole transport layer, 5—second hole transport layer, 6—light emitting layer, 7—first electron transport layer, 8—second electron transport layer, 9—electron injection layer, and 10—cathode; and 100—display screen.

DETAILED DESCRIPTION OF THE EMBODIMENTS

The detailed embodiments are only for illustration of the present disclosure and do not constitute a limitation on the content of the present disclosure. The present disclosure will be further illustrated and described with reference to specific embodiments.

The present disclosure provides an azaphenanthrene compound containing a phosphorus-oxygen group, an organic electroluminescent device including the compound, and a display device having the organic electroluminescent device.

The present disclosure provides a compound, an organic electroluminescent device including the compound, and a display device having the organic electroluminescent device.

According to an embodiment of the present disclosure, a compound having a structure of formula (I) is provided formula (I)

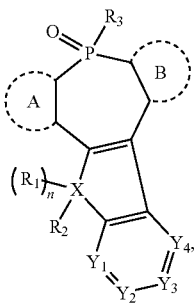

X is selected from a C atom, a Si atom, a B atom, or a P atom; $Y_1$ to $Y_4$ are each independently selected from a C atom, or an N atom; A and B are each independently selected from any one or more of a substituted or unsubstituted C6-C40 aryl group and a substituted or unsubstituted C4-C40 heteroaryl group;

$R_1$ is selected from carbonyl, C1-C9 alkyl, a substituted or unsubstituted C6-C18 aryl group, and a substituted or unsubstituted C4-C30 heteroaryl group; and $R_2$ and $R_3$ are each independently selected from any one of a C1-C9 alkyl group, a substituted or unsubstituted C6-C18 aryl group, and a substituted or unsubstituted C4-C30 heteroaryl group, and n is selected from 0 or 1.

According to an embodiment of the present disclosure, the C6-C40 aryl group is selected from phenyl, naphthyl, and anthryl, and the C4-C40 heteroaryl group is selected from pyridyl, pyrrolyl, indolyl, pyrimidinyl, purinyl, quinolyl, isoquinolyl, furyl, and thienyl.

According to an embodiment of the present disclosure, the C6-C18 aryl group is selected from phenyl, naphthyl, and anthryl, and the C4-C30 heteroaryl group is selected from pyridyl, pyrrolyl, indolyl, pyrimidinyl, purinyl, quinolyl, isoquinolyl, thienyl, furyl, dibenzothiophenyl, and dibenzofuryl.

According to an embodiment of the present disclosure, in the substituted C6-C40 aryl group, the substituted C4-C40 heteroaryl group, the substituted C6-C18 aryl group, and the substituted C4-C30 heteroaryl group, the substituents are each independently selected from any one or more of a C1-C10 alkyl or cycloalkyl group, a C2-C10 alkenyl group, a C1-C6 alkoxy group, a C6-C30 monocyclic aromatic hydrocarbon or fused ring aromatic hydrocarbon group, and a C3-C30 monocyclic heteroaromatic hydrocarbon or fused ring heteroaromatic hydrocarbon group.

The "C6-C30 monocyclic aromatic hydrocarbon or fused ring aromatic hydrocarbon group" may be, for example, phenyl, and polycyclic aryl groups, such as biphenyl, 9,9-fluorenyl, benzene terphenyl, naphthyl, anthryl, phenanthryl, 9,10-benzophenanthryl, 1,2-benzophenanthryl, acenaphthylenyl, perylenyl, pyrenyl, indenyl, and the like.

"C3-C30 monocyclic heteroaromatic hydrocarbon or fused ring heteroaromatic hydrocarbon group" may be, for example, furyl, thienyl, pyrrolyl, oxazolyl, thiazolyl, pyrazolyl, pyranyl, imidazolyl, pyridyl, pyrazinyl, pyrimidinyl, 1,3,4-oxadiazolyl, 1,2,4-triazolyl, 1,3,5-triazinyl, indolyl, benzimidazolyl, dibenzofuranyl, dibenzothiophenyl, carbazolyl, quinolinyl, quinoxalinyl, phenanthrolinyl, phenazinyl, pyridazinyl, etc.

According to an embodiment of the present disclosure, $Y_1$ to $Y_4$ are all C atoms.

According to an embodiment of the present disclosure, at least one of $Y_1$ to $Y_4$ is an N atom.

According to an embodiment of the present disclosure, one or two of $Y_1$ to $Y_4$ are N atoms, and the rest of them are C atoms.

According to an embodiment of the present disclosure, the compound is selected from any one of P01 to P72.

According to an embodiment of the present disclosure, the compound is selected from any one of P01, P02, P03, P05, P07, P09, P11, P59, P65, and P70.

According to another embodiment of the present disclosure, provided is an organic electroluminescent device including a first electrode and a second electrode, and an organic functional layer located between the first electrode and the second electrode, the organic functional layer including an electron transport layer, and the electron transport material of the electron transport layer includes the compound according to the present disclosure.

According to an embodiment of the present disclosure, the organic functional layer further includes a hole blocking layer, and the electron transport material of the hole blocking layer includes the compound according to the present disclosure.

According to an embodiment of the present disclosure, the organic electroluminescent device includes a substrate, an anode and a cathode that are disposed oppositely, and an organic functional layer located between the anode and the cathode, the organic functional layer including an electron injection layer, an electron transport layer, a light emitting layer, a hole transport layer, and a hole injection layer.

As shown in FIG. 1, the organic electroluminescent device according to an embodiment of the present disclosure includes a substrate 1, an ITO anode 2, a hole injection layer 3, a first hole transport layer 4, a second hole transport layer 5, a light emitting layer 6, a first electron transport layer 7, a second electron transport layer 8, an electron injection layer 9, and a cathode 10 that are arranged sequentially.

The structure of the organic electroluminescent device may be a mono light emitting layer or multi light emitting layers.

In one embodiment, the substrate may be a substrate in a conventional organic electroluminescent device, such as glass or plastic. The anode may use a transparent and highly-conductive material, such as indium tin oxide (ITO), indium zinc oxide (IZO), tin dioxide ($SnO_2$), and zinc oxide (ZnO).

It is required that the hole injection material (referred to as HIM for short) of the hole injection layer has a high thermal stability (high Tg), and a small potential barrier with the anode, and may form a pinhole-free film by vacuum vapor deposition. All of the commonly used HTMs are aromatic polyamine compounds, and mainly triarylamine derivatives.

It is required that the hole transport material (referred to as HTM for short) of the hole transport layer has high thermal stability (high Tg) and high hole transporting capability, and may form a pinhole-free film by vacuum vapor deposition. All of the commonly used HTMs are aromatic polyamine compounds, and mainly triarylamine derivatives.

The organic light emitting layer includes a host material and a guest material, and the guest material is a luminescent material, such as a dye, and the host material is required to have the following characteristics: a reversible electrochemical redox potential, HOMO and LUMO energy levels matched with the adjacent hole and electron transport layers, good and matched hole and electron transporting capabilities, good and high thermal stability and film forming property, and suitable singlet or triplet energy gaps for controlling good energy transfer of excitons in the light emitting layer, as well as with a corresponding fluorescent dye or phosphorescent dye. The luminescent material of the organic light emitting layer, taking a dye as an example, is required to have the following characteristics: has high fluorescence or phosphorescence quantum efficiency; the absorption spectrum of the dye has a good overlap with the emission spectrum of the host, that is, the host and the dye are matched in energy and energy can be effectively transferred from the host to the dye; the emission peaks of red, green, and blue are as narrow as possible to obtain good color purity; and has a good stability and may be subjected to vapor deposition and the like.

It is required that the electron transport material (referred to as ETM) of the electron transport layer has a reversible and sufficiently-high electrochemical reduction potential, and appropriate HOMO and LUMO (lowest unoccupied molecular orbital) energy level values for enabling better injection of electrons, and may have a hole blocking capability; a higher electron transport capability, a good film-forming property and thermal stability. ETM is generally an aromatic compound having a conjugated plane of an electron-deficient structure. The electron transport layer adopts Alq3 (8-hydroxyquinoline aluminum) or TAZ (3-phenyl-4-(1'-naphthyl)-5-benzene-1,2,4-triazole) or TPBi (1,3,5-tris (N-phenyl-2-benzimidazole)benzene) or a combination of any two selected from the three materials.

In the present disclosure, the manufacturing process of the organic electroluminescent device is as follows: an anode (first electrode) is formed on a transparent or opaque smooth substrate, an organic functional layer is formed on the anode, and a cathode (second electrode) is formed on the organic functional layer. The organic functional layer may be formed by known film-forming methods such as vapor deposition, sputtering, spin coating, dipping, ion plating, etc.

According to another embodiment of the present disclosure, provided is a display device including the organic electroluminescent device according to the present disclosure.

Figure 2:
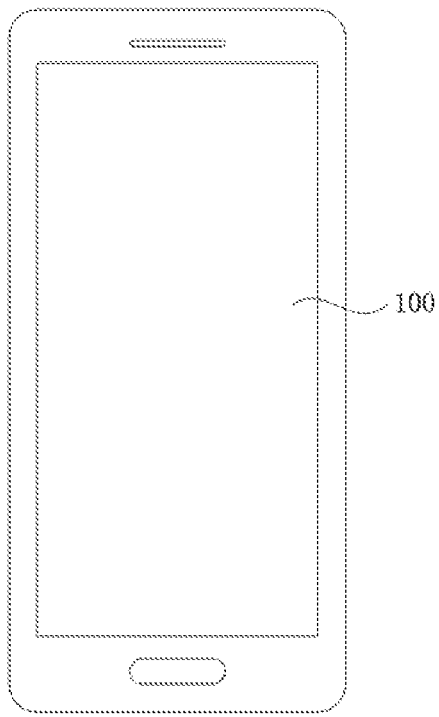
FIG. 2 is a schematic diagram of a display screen of a mobile phone.

According to an embodiment of the present disclosure, the display device may be a mobile phone, a computer, a liquid crystal television, a smart watch, a smart car, a VR or AR helmet, etc. The present disclosure is not particularly limited to this. FIG. 2 is a schematic diagram of a display screen of a mobile phone, and 100 denotes the display screen.

It can be seen from this that there are many optional factors for the compound, organic electroluminescent device and display device according to the present disclosure, and different embodiments may be obtained through combination according to the claims of the present disclosure. The embodiments of the present disclosure are only used as specific description of the present disclosure, and are not intended to limit the present disclosure. The present disclosure will be further described below in connection with an organic electroluminescent device including the compound of the present disclosure as an example.

Synthesis of P01

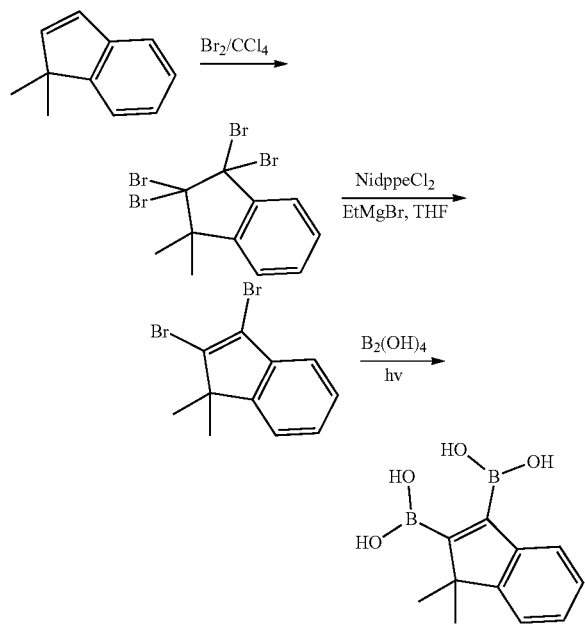

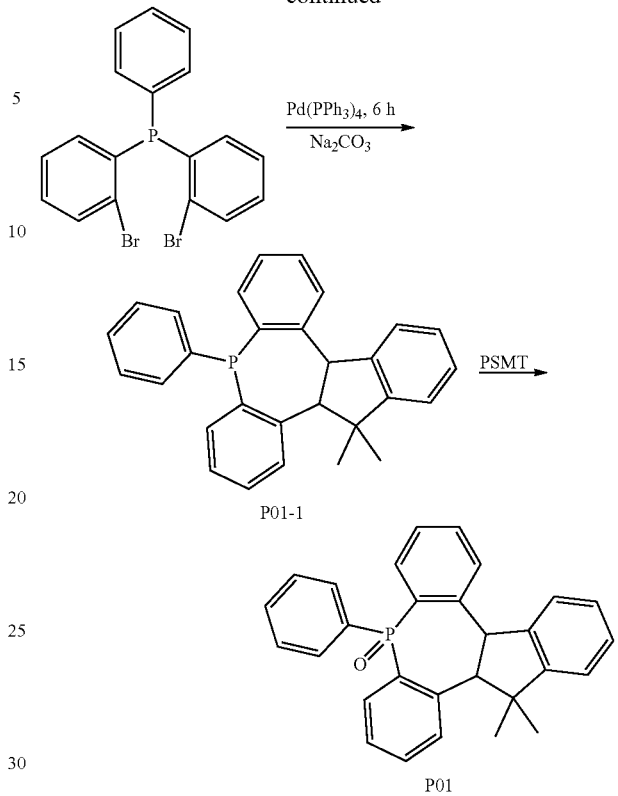

In a 250 ml round bottom flask, 1,1-dimethyl-1H-indene (15 mmol) and Br$_2$ (35 mmol) were added into anhydrous carbon tetrachloride (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product 1,1-dimethyl-3,3,4,4-tetrabromobenzocyclopentane.

In a 250 ml round bottom flask, 1,1-dimethyl-3,3,4,4-tetrabromobenzocyclopentane (15 mmol) and NidppeCl$_2$ (10%, 1.5 mmol) were added into anhydrous tetrahydrofuran (100 ml), and under nitrogen atmosphere, EtMgBr (15 mmol) is continually added dropwise to react for 24 hours at 0° C. to obtain an intermediate mixed solution. The intermediate mixed solution was added into water and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product 1,1-dimethyl-3,4-dibromo-1H-indene.

In a 250 ml round-bottom flask, 1,1-dimethyl-3,4-dibromo-1H-indene (15 mmol) and tetrahydroxydiboron (24 mmol) were added into anhydrous methanol (100 ml), irradiated with UV (254 nm) under nitrogen atmosphere, and reacted at 15° C. for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product 1,1-dimethyl-3,4-diboronic acid-1H-indene.

In a 250 ml round bottom flask, 1,1-dimethyl-3,4-diboronic acid-1H-indene (18 mmol), 10 mol % Pd(PPh$_3$)$_4$, Na$_2$CO$_3$ (30 mmol), and bis(2-bromophenyl)phenylphosphine (15 mmol) were added into anhydrous toluene (100 ml), refluxed under nitrogen atmosphere for 6 hours. The obtained intermediate was cooled to room temperature, added into water, and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P01-1.

In a 250 ml round bottom flask, P01-1 (15 mmol) and PSMT (15 mmol) were added into anhydrous methanol (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain the final product P01.

The element analysis results of the compound P01 (molecular formula of C$_{29}$H$_{25}$OP): the theoretical values: C, 82.86; H, 5.95; O, 3.81; P, 7.38. Test values: C, 82.86; H, 5.95; O, 3.81; P, 7.38. ESI-MS (m/z) (M+) obtained by analysis through liquid chromatography-mass spectrometry: the theoretical value was 420.16, and the test value was 420.15.

Synthesis of P02

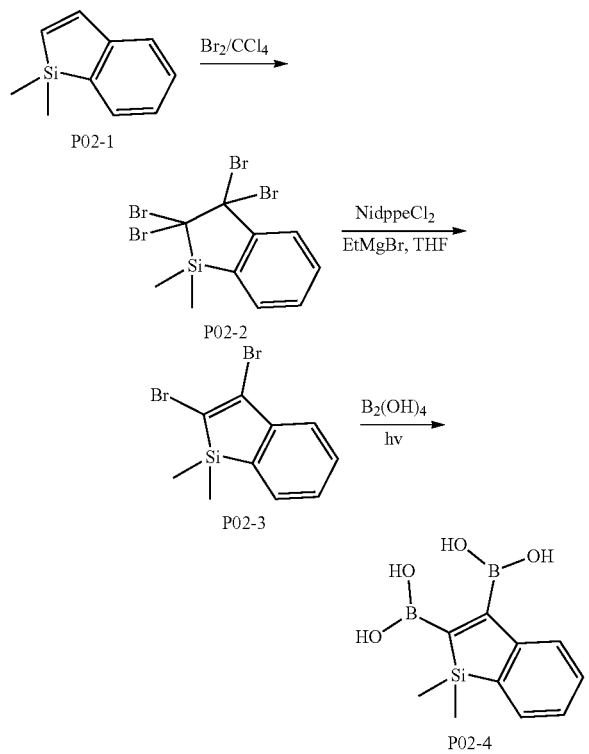

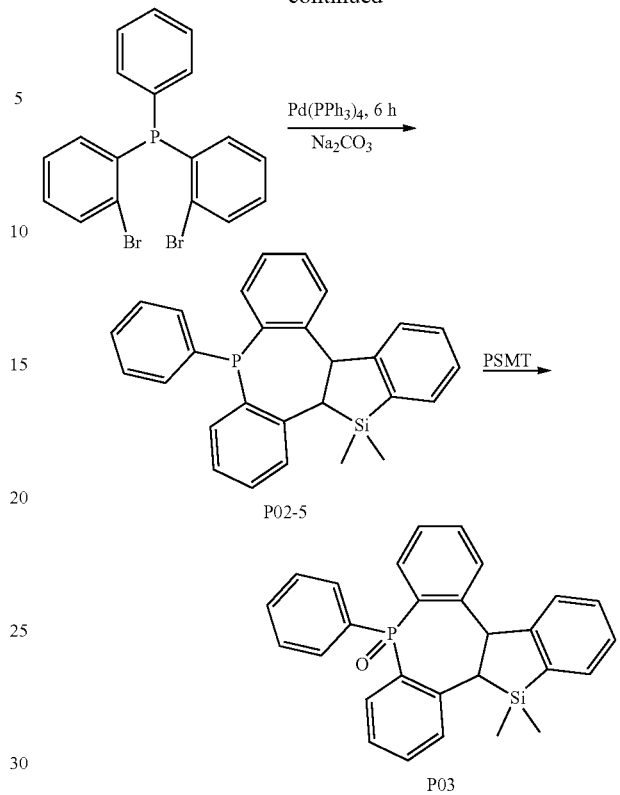

In a 250 ml round bottom flask, P02-1 (15 mmol) and Br$_2$ (35 mmol) were added into anhydrous carbon tetrachloride (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P02-2.

In a 250 ml round bottom flask, P02-2 (15 mmol) and NidppeCl$_2$ (10%, 1.5 mmol) were added into anhydrous tetrahydrofuran (100 ml), and under nitrogen atmosphere, EtMgBr (15 mmol) is continually added dropwise to react for 24 hours at 0° C. to obtain an intermediate mixed solution. The intermediate mixed solution was added into water and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P02-3.

In a 250 ml round-bottom flask, P02-3 (15 mmol) and tetrahydroxydiboron (24 mmol) were added into anhydrous methanol (100 ml), irradiated with UV (254 nm) under nitrogen atmosphere, and reacted at 15° C. for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P02-4.

In a 250 ml round bottom flask, P02-4 (18 mmol), 10 mol % Pd(PPh$_3$)$_4$, Na$_2$CO$_3$ (30 mmol), and bis(2-bromophenyl)phenylphosphine (15 mmol) were added into anhydrous toluene (100 ml), refluxed under nitrogen atmosphere for 6 hours. The obtained intermediate was cooled to room temperature, added into water, and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P02-5.

In a 250 ml round bottom flask, P02-5 (15 mmol) and PSMT (15 mmol) were added into anhydrous methanol (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain the final product P02.

The element analysis results of the compound P02 (molecular formula of C$_{28}$H$_{23}$OPSi): the theoretical values: C, 77.42; H, 5.30; O, 3.69; P, 7.14; Si, 6.45. Test values: C, 77.42; H, 5.30; O, 3.69; P, 7.14; Si, 6.45. ESI-MS (m/z) (M+) obtained by analysis through liquid chromatography-mass spectrometry: the theoretical value was 434.13, and the test value was 434.14.

Synthesis of P03

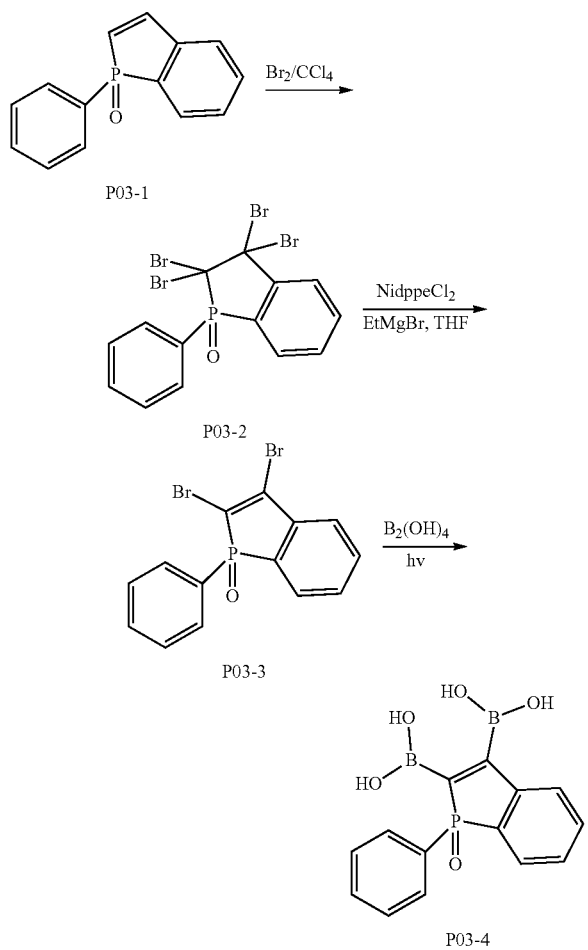

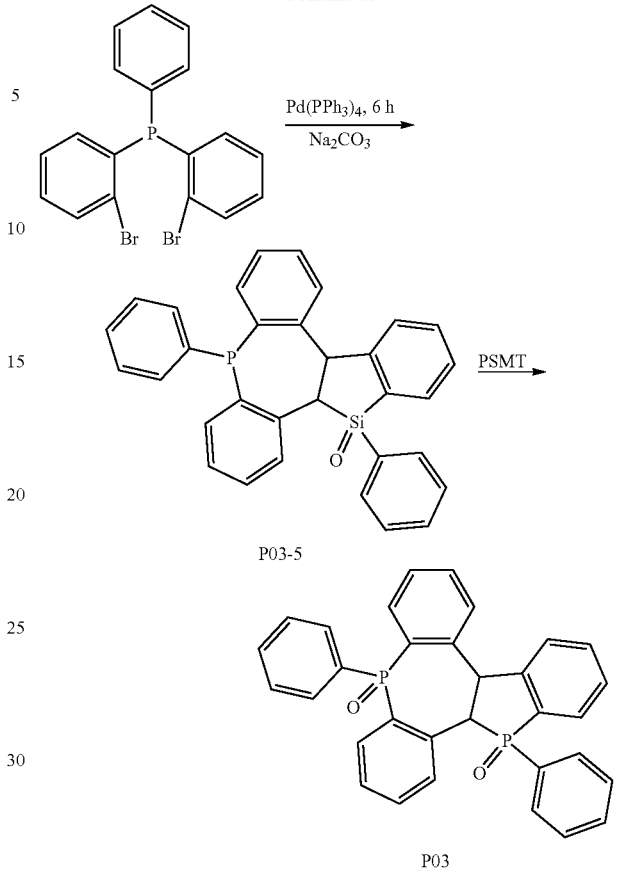

In a 250 ml round bottom flask, P03-1 (15 mmol) and Br$_2$ (35 mmol) were added into anhydrous carbon tetrachloride (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P03-2.

In a 250 ml round bottom flask, P03-2 (15 mmol) and NidppeCl$_2$ (10%, 1.5 mmol) were added into anhydrous tetrahydrofuran (100 ml), and EtMgBr (15 mmol) is continually added dropwise under nitrogen atmosphere to react for 24 hours at 0° C. to obtain an intermediate mixed solution. The intermediate mixed solution was added into water and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P03-3.

In a 250 ml round-bottom flask, P03-3 (15 mmol) and tetrahydroxydiboron (24 mmol) were added into anhydrous methanol (100 ml), irradiated with UV (254 nm) under nitrogen atmosphere, and reacted at 15° C. for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P03-4.

In a 250 ml round bottom flask, P03-4 (18 mmol), 10 mol % Pd(PPh$_3$)$_4$, Na$_2$CO$_3$ (30 mmol), and bis(2-bromophenyl) phenylphosphine (15 mmol) were added into anhydrous toluene (100 ml), refluxed under nitrogen atmosphere for 6 hours. The obtained intermediate was cooled to room temperature, added into water, and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P03-5.

In a 250 ml round bottom flask, P03-5 (15 mmol) and PSMT (15 mmol) were added into anhydrous methanol (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain the final product P03.

The element analysis results of the compound P03 (molecular formula of C$_{32}$H$_{24}$O$_2$P2): the theoretical values: C, 76.49; H, 4.78; O, 6.37; P, 6.17; Si, 6.19. Test values: C, 76.49; H, 4.78; O, 6.37; P, 6.17; Si, 6.19. ESI-MS (m/z) (M+) obtained by analysis through liquid chromatography-mass spectrometry: the theoretical value was 502.13, and the test value was 502.14.

Synthesis of P05

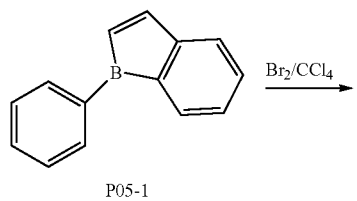

P05-1

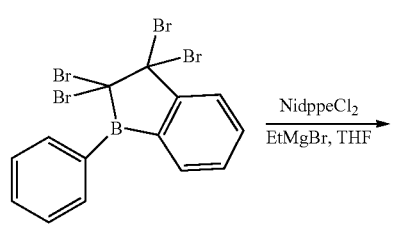

P05-2

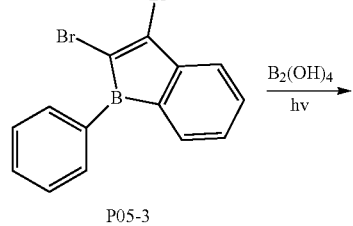

P05-3

-continued

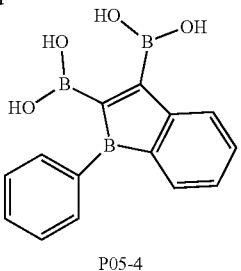

P05-4

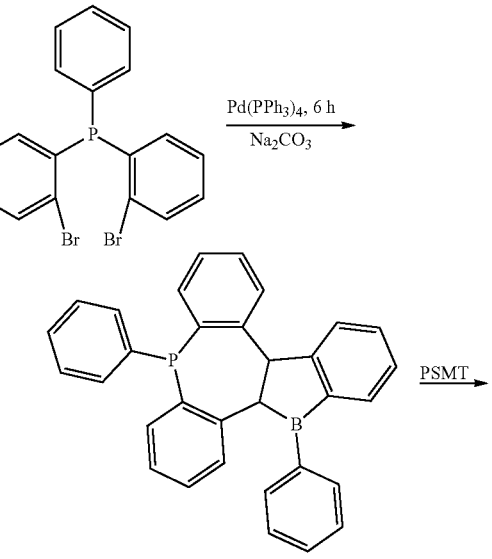

P05-5

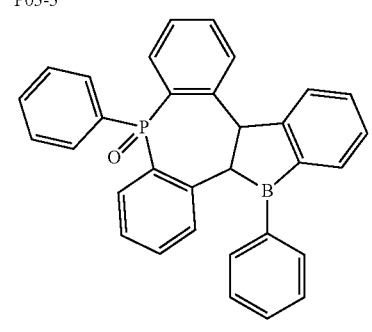

P05

In a 250 ml round bottom flask, P05-1 (15 mmol) and Br$_2$ (35 mmol) were added into anhydrous carbon tetrachloride (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P05-2.

In a 250 ml round bottom flask, P05-2 (15 mmol) and NidppeCl$_2$ (10%, 1.5 mmol) were added into anhydrous tetrahydrofuran (100 ml), and EtMgBr (15 mmol) is continually added dropwise under nitrogen atmosphere to react for 24 hours at 0° C. to obtain an intermediate mixed solution. The intermediate mixed solution was added into water and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P05-3.

In a 250 ml round-bottom flask, P05-3 (15 mmol) and tetrahydroxydiboron (24 mmol) were added into anhydrous methanol (100 ml), irradiated with UV (254 nm) under nitrogen atmosphere, and reacted at 15° C. for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P05-4.

In a 250 ml round bottom flask, P05-4 (18 mmol), 10 mol % Pd(PPh$_3$)$_4$, Na$_2$CO$_3$ (30 mmol), and bis(2-bromophenyl)phenylphosphine (15 mmol) were added into anhydrous toluene (100 ml), refluxed under nitrogen atmosphere for 6 hours. The obtained intermediate was cooled to room temperature, added into water, and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P05-5.

In a 250 ml round bottom flask, P05-5 (15 mmol) and PSMT (15 mmol) were added into anhydrous methanol (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain the final product P05.

The element analysis results of the compound P05 (molecular formula of C$_{32}$H$_{22}$BOP): the theoretical values: C, 82.76; H, 4.74; B, 2.37; O, 3.45; P, 6.17. Test values: C, 82.76; H, 4.74; B, 2.37; O, 3.45; P, 6.17. ESI-MS (m/z) (M+) obtained by analysis through liquid chromatography-mass spectrometry: the theoretical value was 464.15, and the test value was 464.14.

Synthesis of P07

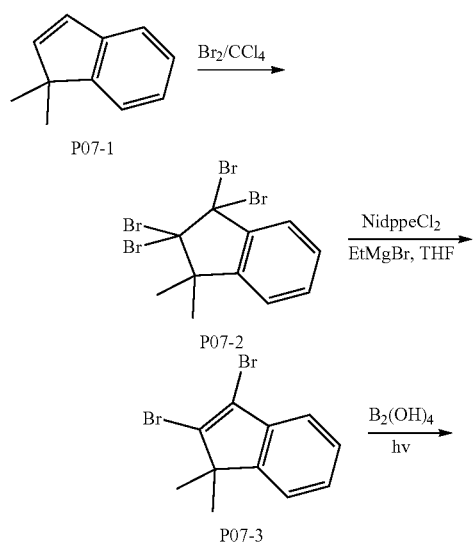

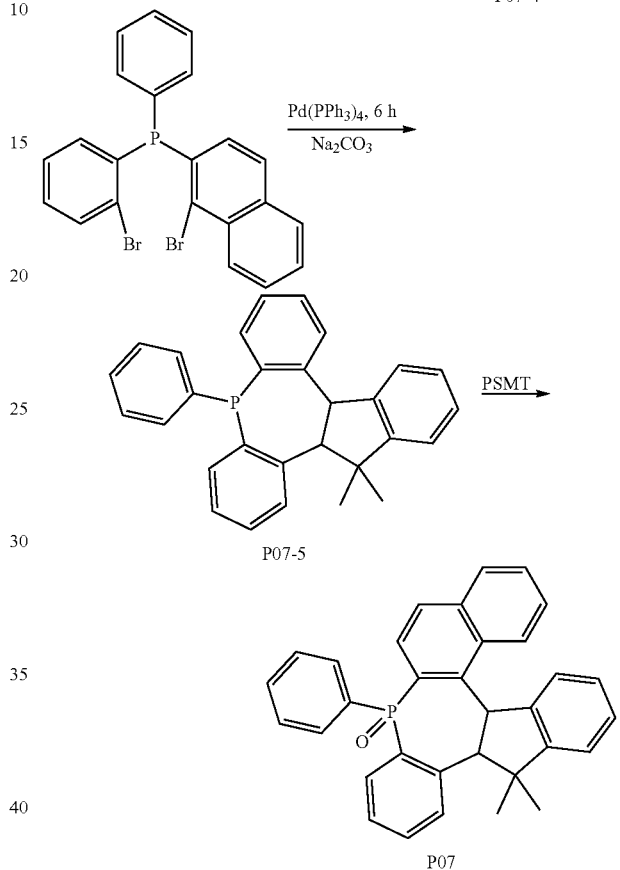

In a 250 ml round bottom flask, P07-1 (15 mmol) and Br$_2$ (35 mmol) were added into anhydrous carbon tetrachloride (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P07-2.

In a 250 ml round bottom flask, P07-2 (15 mmol) and NidppeCl$_2$ (10%, 1.5 mmol) were added into anhydrous tetrahydrofuran (100 ml), and EtMgBr (15 mmol) is continually added dropwise under nitrogen atmosphere to react for 24 hours at 0° C. to obtain an intermediate mixed solution. The intermediate mixed solution was added into water and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P07-3.

In a 250 ml round-bottom flask, P07-3 (15 mmol) and tetrahydroxydiboron (24 mmol) were added into anhydrous methanol (100 ml), irradiated with UV (254 nm) under nitrogen atmosphere, and reacted at 15° C. for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P07-4.

In a 250 ml round bottom flask, P07-4 (18 mmol), 10 mol % Pd(PPh$_3$)$_4$, Na$_2$CO$_3$ (30 mmol), and bis(2-bromophenyl)phenylphosphine (15 mmol) were added into anhydrous toluene (100 ml), refluxed under nitrogen atmosphere for 6 hours. The obtained intermediate was cooled to room temperature, added into water, and then filtered through a diatomite pad. The filtrate was extracted with dichloromethane, then washed with water, dried with anhydrous magnesium sulfate, filtered and evaporated, and then the crude product was purified by silica gel column chromatography to obtain an intermediate product P07-5.

In a 250 ml round bottom flask, P07-5 (15 mmol) and PSMT (15 mmol) were added into anhydrous methanol (100 ml), and under nitrogen atmosphere, reacted at room temperature for 24 hours to obtain an intermediate mixed solution. The intermediate mixed solution was added into water, then filtered through a diatomite pad. The filtrate was extracted with dichloromethane, then washed with water, dried with anhydrous magnesium sulfate, filtered and evaporated, and then the crude product was purified by silica gel column chromatography to obtain the final product P07.

The element analysis results of the compound P07 (molecular formula of C$_{33}$H$_{25}$OP): the theoretical values: C, 84.62; H, 5.34; O, 3.42; P, 6.62. Test values: C, 84.62; H, 5.34; O, 3.42; P, 6.62. ESI-MS (m/z) (M+) obtained by analysis through liquid chromatography-mass spectrometry: the theoretical value was 468.16, and the test value was 468.15.

Other compounds are also obtained by using similar synthetic methods.

Performance Test (1) Simulated Calculation of Compounds

The energy level difference between singlet and triplet states of the organic materials may be completed via software Guassian 09 (Guassian Inc.). For the specific method of simulating the energy level difference, refer to J. Chem. Theory Comput., 2013, DOI:10.1021/ct400415r. Both the optimization and excitation of a molecular structure can be completed by a TD-DFT method "B3LYP" and a basic group "6-31g(d)", and Tg is measured by differential scanning calorimetry. In the present disclosure, compounds P01, P02, P03, P05, P07, P09, P51, P59, P65 and P70 are subjected to simulated calculation, and the results are shown in Table 1.

TABLE 1

| Serial Number | Compound | HOMO (eV) | LUMO (eV) | $E_T$ (eV) |
|---|---|---|---|---|
| Example 1 | P01 | −5.900 | −2.183 | 2.7632 |
| Example 2 | P02 | −5.962 | −2.393 | 2.6035 |
| Example 3 | P03 | −5.902 | −2.301 | 2.4517 |
| Example 4 | P05 | −5.510 | −2.424 | 1.7932 |
| Example 5 | P07 | −5.120 | −1.972 | 2.6935 |
| Example 6 | P09 | −5.860 | −2.351 | 2.6213 |
| Example 7 | P11 | −5.863 | −2.366 | 2.6213 |

TABLE 1-continued

| Serial Number | Compound | HOMO (eV) | LUMO (eV) | $E_T$ (eV) |
|---|---|---|---|---|
| Example 8 | P59 | −5.960 | −1.999 | 2.5972 |
| Example 9 | P65 | −5.943 | −2.142 | 2.5113 |
| Example 10 | P70 | −5.967 | −2.014 | 2.3648 |

It can be seen from Table 1 that, the compounds prepared in the examples of the present disclosure may be used as an electron transport material, has a proper HOMO value and a lower LUMO value, can improve the electron transporting capability and block holes effectively; and meanwhile, it has a higher triplet level $E_T$, a high electron mobility, excellent thermal stability and film stability, which is beneficial for improving the luminous efficiency.

Application of Examples 1-10 and Comparative Examples 1-2

The compounds and structures thereof partly involved in this application of examples section are shown as follows:

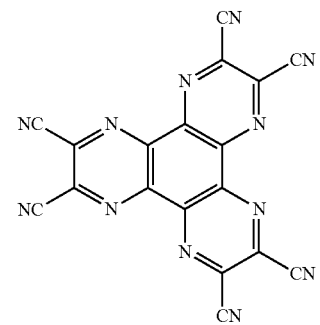

HAT-CN

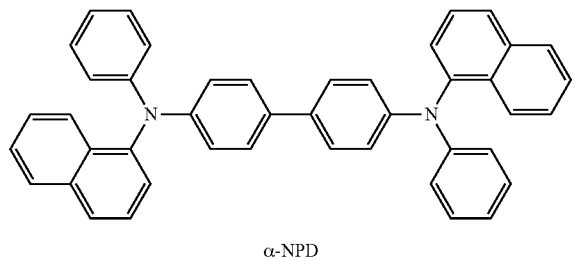

α-NPD

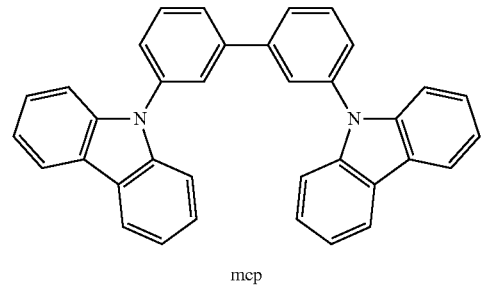

mcp

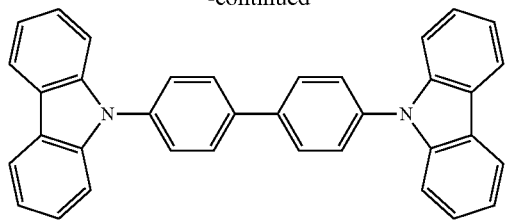

CBP

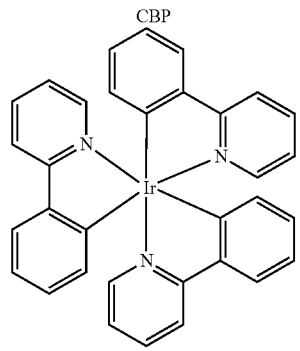

Ir(ppy)₃

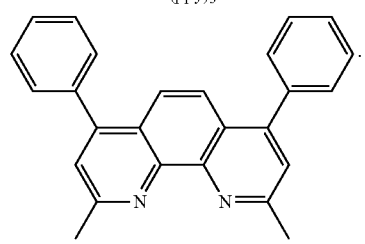

BPen

This example provides an OLED device. As shown in FIG. 1, the OLED device includes a substrate 1, an ITO anode 2, a hole injection layer 3, a first hole transport layer 4, a second hole transport layer 5, a light emitting layer 6, a first electron transport layer 7, a second electron transport layer 8, an electron injection layer 9, and a cathode 10 (aluminum electrode), and the thickness of the ITO anode 2 is 10 nm, the thickness of the hole injection layer 3 is 5 nm, the thickness of the first hole transport layer 4 is 50 nm, the thickness of the second hole transport layer 5 is 10 nm, the thickness of the light emitting layer 6 is 20 nm, the thickness of the first electron transport layer 7 is 5 nm, the thickness of the second electron transport layer 8 is 20 nm, the thickness of the electron injection layer 9 is 1 nm, and the thickness of the aluminum electrode 10 is 15 nm.

The preparation steps of the OLED device of the present disclosure are as follows:

1) the glass substrate 1 is cut into a size of 50 mm×50 mm×0.7 mm, ultrasonically treated respectively in isopropyl alcohol and deionized water for 30 minutes, and then exposed to ozone for about 10 minutes for cleaning; and the resultant glass substrate 1 having the ITO anode 2 is mounted onto a vacuum deposition apparatus;

2) a hole injection layer material HAT-CN is vapor-deposited on the layer of ITO anode 2 in a vacuum vapor deposition manner to a thickness of 5 nm under a vacuum degree of $2\times10^{-6}$ Pa, for serving as the hole injection layer 3;

3) the material of the first hole transport layer 4, N,N'-diphenyl-N,N'-(1-naphthyl)-1,1'-biphenyl-4,4'-diamine (al-pha-NPD), is deposited on the hole injection layer 3 by vacuum vapor deposition to a thickness of 50 nm, for serving as the first hole transport layer 4;

4) the material of the second hole transport layer 5, 1,3-dicarbazole-9-ylbenzene (mCP), is deposited on the first hole transport layer 4 by vacuum vapor deposition to a thickness of 10 nm, for serving as the second hole transport layer 5;

5) the light emitting layer 6 is co-deposited on the second hole transport layer 5 to a thickness of 20 nm, and the light emitting layer 6 has a host material of CBP and a guest material of Ir(pyy)₃ at the mass ratio of the compounds CBP to Ir(ppy)₃ of 97:3;

6) the first electron transport layer 7 is deposited on the light emitting layer 6 by vacuum vapor deposition to a thickness of 5 nm, and the material of the first electron transport layer 7 is the compound of the present disclosure or the compounds of Comparative Examples 1 and 2;

7) the second electron transport layer 8 is deposited on the first electron transport layer 7 by vacuum vapor deposition to a thickness of 20 nm, and the second electron transport layer 8 has a material of BPen;

8) the electron injection layer 9 is deposited on the second electron transport layer 8 by vacuum vapor deposition to a thickness of 1 nm, and the electron injection layer 9 has a material of LiF; and 9) an aluminum electrode is deposited on the electron injection layer 9 by vacuum vapor deposition to a thickness of 15 nm, for serving as the cathode 10.

The performances of the organic electroluminescent devices are as shown in Table 2.

TABLE 2

| | Electron Transport Material | Driving Voltage V | Current Efficiency cd/A | EQE (max) (%) | Service Life LT95 |
|---|---|---|---|---|---|
| Comparative Example 1 | Alq3 | 4.22 | 62.7 | 6.9 | 101.3 |
| Comparative Example 2 | BPhen | 4.28 | 65.7 | 6.6 | 113.5 |
| Example 1 | P01 | 3.62 | 74.5 | 7.4 | 121.3 |
| Example 2 | P02 | 3.71 | 75.8 | 15.3 | 120.3 |
| Example 3 | P03 | 3.84 | 76.6 | 8.0 | 121.2 |
| Example 4 | P05 | 3.59 | 84.9 | 7.6 | 120.5 |
| Example 5 | P07 | 3.80 | 79.6 | 9.2 | 120.6 |
| Example 6 | P09 | 3.67 | 76.5 | 13.3 | 120.7 |
| Example 7 | P11 | 3.80 | 77.6 | 9.9 | 122.1 |
| Example 8 | P059 | 3.63 | 76.1 | 11.4 | 121.5 |
| Example 9 | P065 | 3.80 | 83.9 | 7.7 | 120.6 |
| Example 10 | P070 | 3.79 | 79.6 | 8.9 | 120.8 |

As can be seen from Table 2, the OLED device provided by the present disclosure has a lower driving voltage, as well as higher luminous efficiency and a longer service life. Compared with the comparative examples, the examples of the present disclosure have a driving voltage less than 3.84V, which is increased by 10.2%; a luminous efficiency more than 74.5 Cd/A, which is increased by 13.4%; and a service life longer than 120 h, which is increased by 5.7%. Compared with the comparative examples, all of the above performances of the display panels are improved, which mainly benefits from the fact that the material of the present disclosure has a deeper HOMO value and a higher triplet energy level, and can effectively block the backflow of excitons and prevent holes from crossing the light emitting layer.

What is claimed is:

1. A compound having a structure of formula (I)

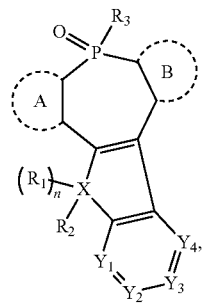

formula (I)

X is selected from a C atom, a Si atom, a B atom, or a P atom; $Y_1$ to $Y_4$ are each independently selected from a C atom, or an N atom; A and B are each independently selected from any one or more of a substituted or unsubstituted C6-C40 aryl group and a substituted or unsubstituted C4-C40 heteroaryl group;

$R_1$ is selected from carbonyl, C1-C9 alkyl, a substituted or unsubstituted C6-C18 aryl group, and a substituted or unsubstituted C4-C30 heteroaryl group; and $R_2$ and $R_3$ are each independently selected from any one of a C1-C9 alkyl group, a substituted or unsubstituted C6-C18 aryl group, and a substituted or unsubstituted C4-C30 heteroaryl group, and n is selected from 0 or 1.

2. The compound according to claim 1, wherein the C6-C40 aryl group is selected from phenyl, naphthyl, and anthryl, and the C4-C40 heteroaryl group is selected from pyridyl, pyrrolyl, indolyl, pyrimidinyl, purinyl, quinolyl, isoquinolyl, furyl, and thienyl.

3. The compound according to claim 1, wherein the C6-C18 aryl group is selected from phenyl, naphthyl, and anthryl, and the C4-C30 heteroaryl group is selected from pyridyl, pyrrolyl, indolyl, pyrimidinyl, purinyl, quinolyl, isoquinolyl, thienyl, furyl, dibenzothiophenyl, and dibenzofuryl.

4. The compound according to claim 1, wherein in the substituted C6-C40 aryl group, the substituted C4-C40 heteroaryl group, the substituted C6-C18 aryl group, and the substituted C4-C30 heteroaryl group, substituents are each independently selected from any one or more of a C1-C10 alkyl or cycloalkyl group, a C2-C10 alkenyl group, a C1-C6 alkoxy group, a C6-C30 monocyclic aromatic hydrocarbon or fused ring aromatic hydrocarbon group, and a C3-C30 monocyclic heteroaromatic hydrocarbon or fused ring heteroaromatic hydrocarbon group.

5. The compound according to claim 1, wherein $Y_1$ to $Y_4$ are all C atoms.

6. The compound according to claim 1, wherein at least one of $Y_1$ to $Y_4$ is an N atom.

7. The compound according to claim 1, wherein one or two of $Y_1$ to $Y_4$ are N atoms, and the rest are C atoms.

8. The compound according to claim 1, wherein the compound is selected from any one of

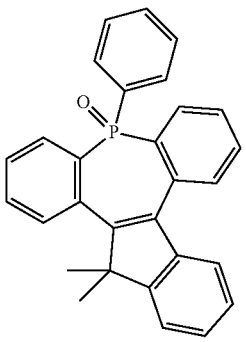

P01

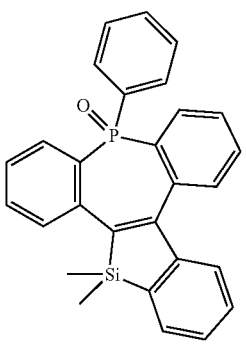

P02

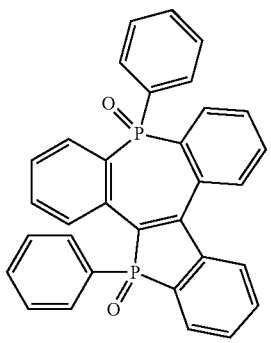

P03

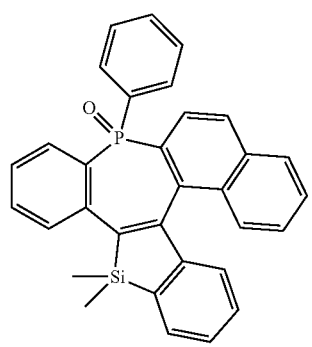

P04

P05
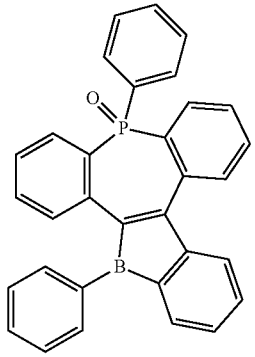
P06
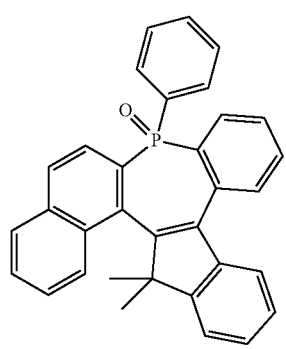
P07
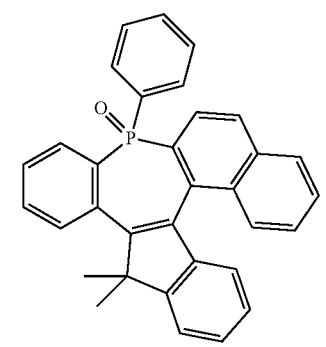
P08
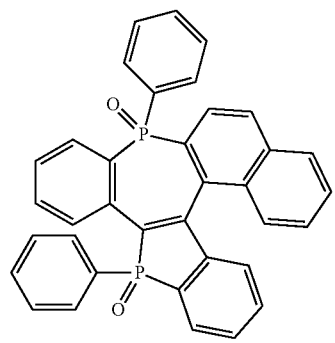
P09
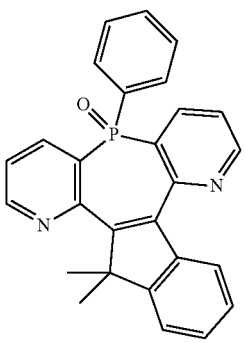
P10
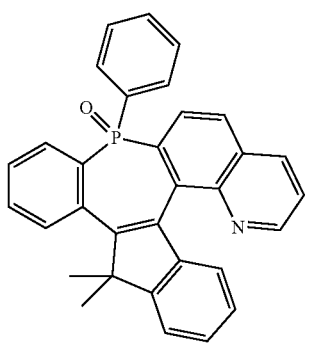
P11
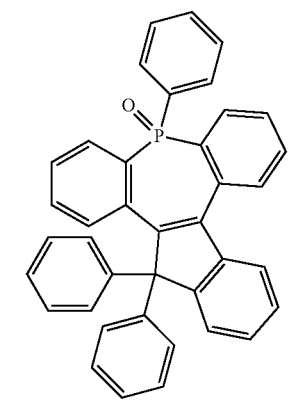
P12
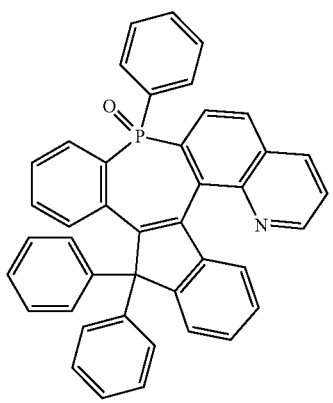

P13
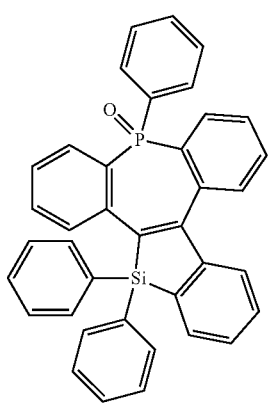
P14
P15
P16
P17
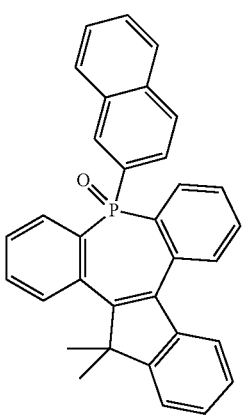
P18
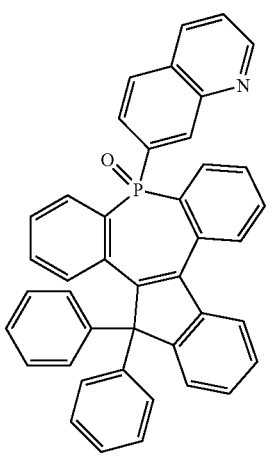
P19
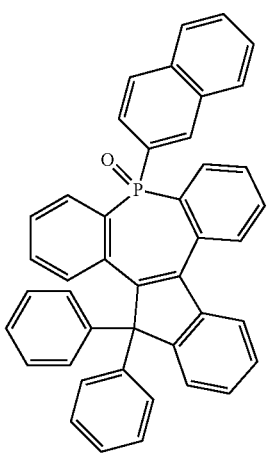

P20
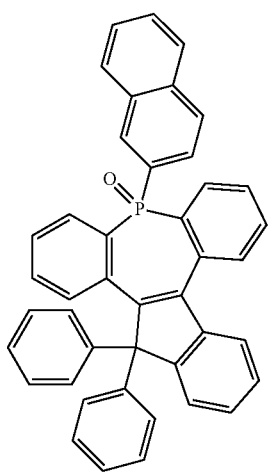
P21
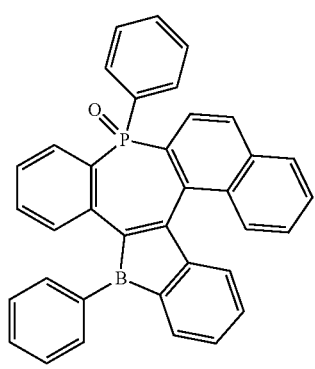
P22
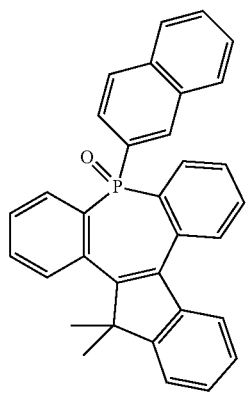
P23
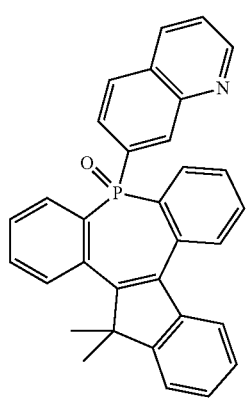
P24
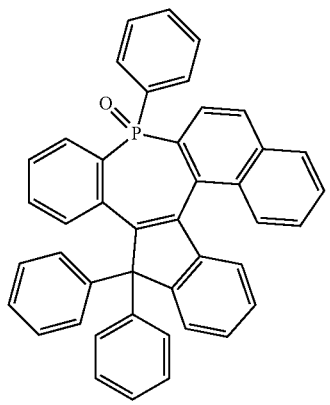
P25
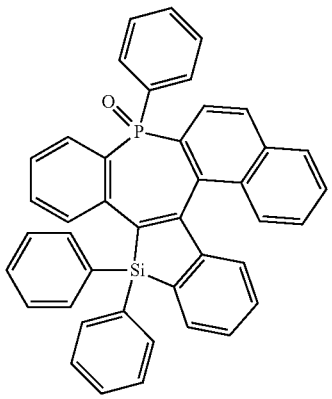
P26
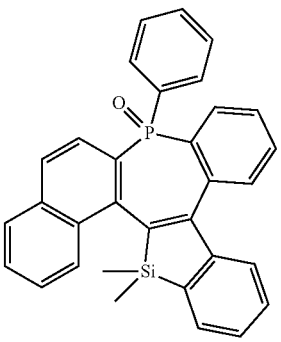
P27
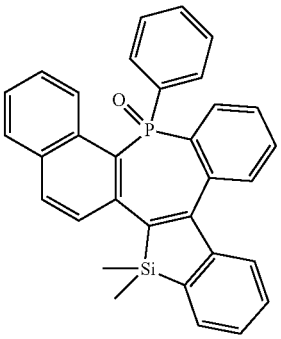

P28
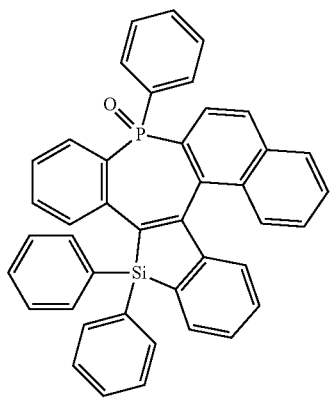
P29
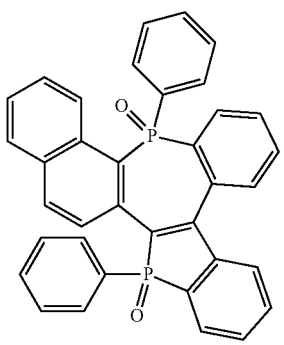
P30
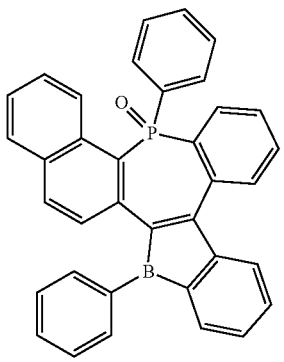
P31
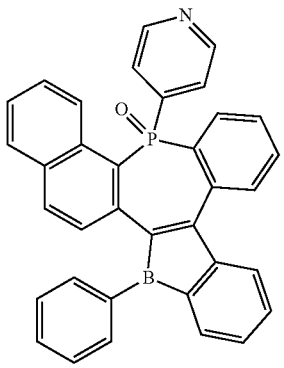
P32
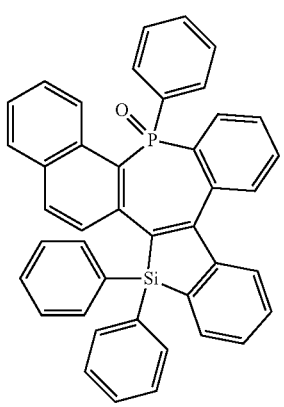
P33
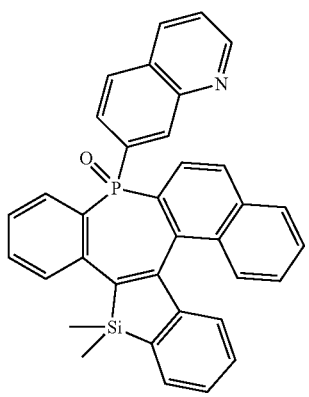
P34
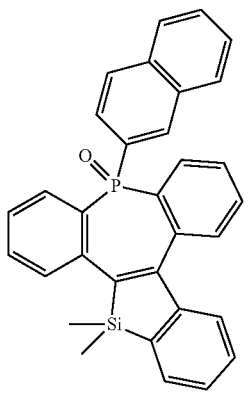
P35
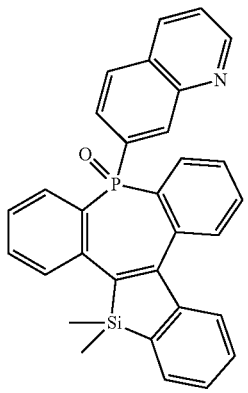

-continued
P36
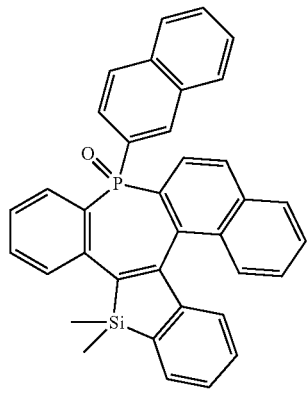
P37
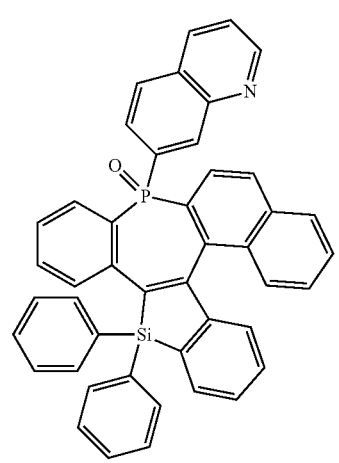
P38
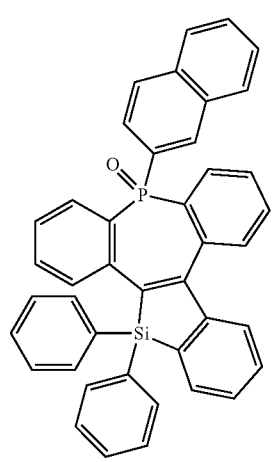
-continued
P39
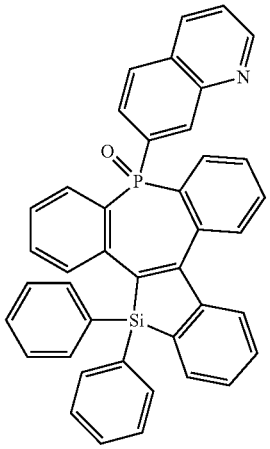
P40
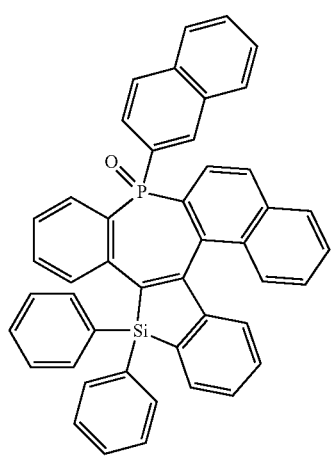
P41
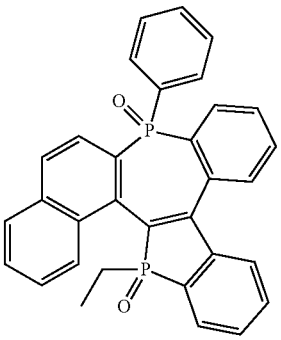
P42
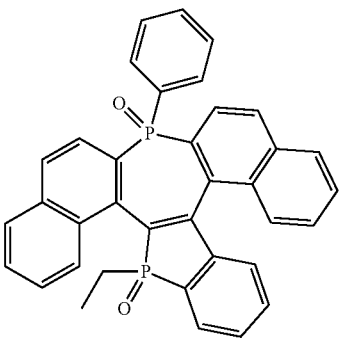

P43
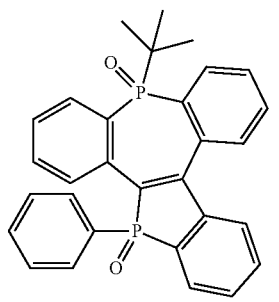
P44
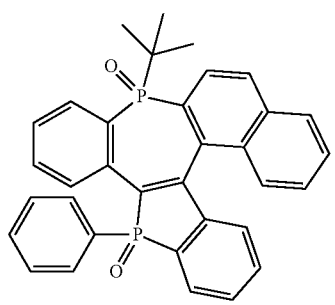
P45
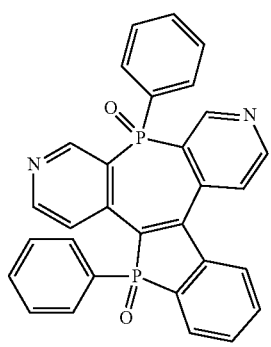
P46
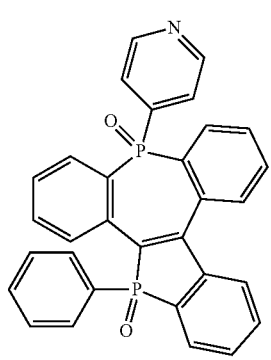
P47
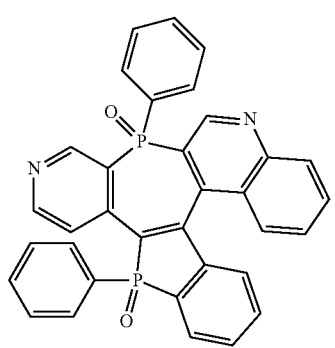
P48
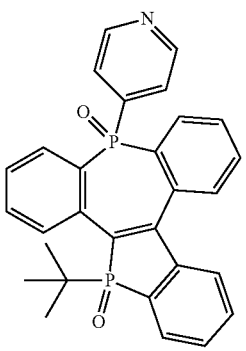
P49
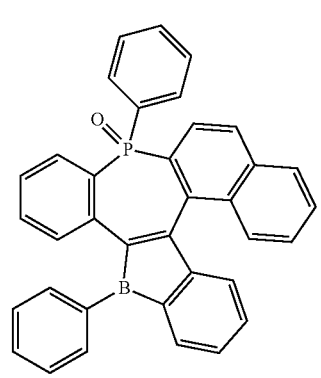
P50
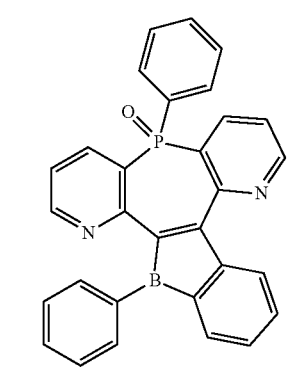
P51
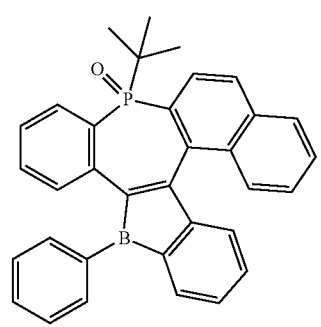

-continued
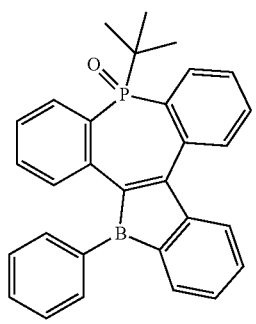
P52
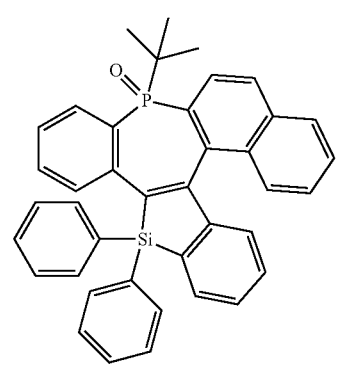
P53
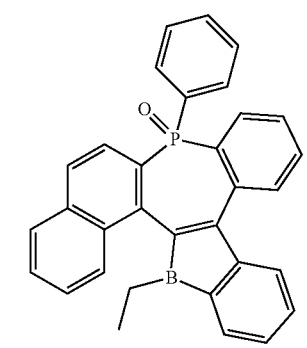
P54
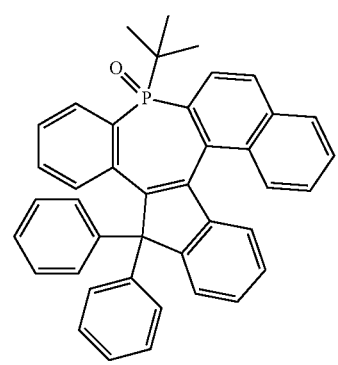
P55
-continued
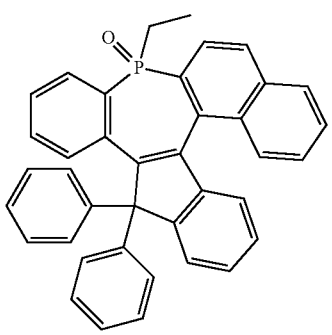
P56
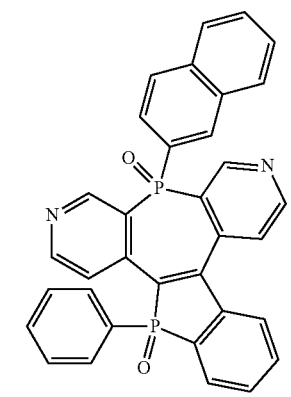
P57
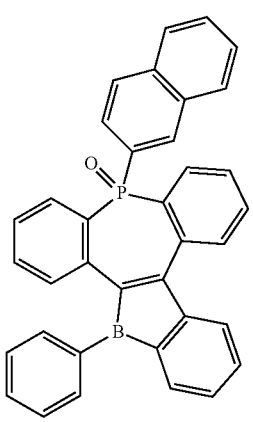
P58
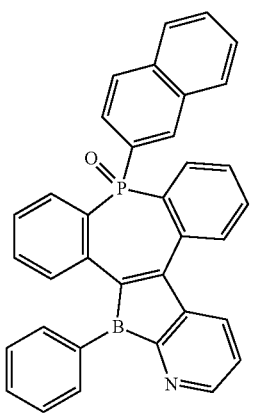
P59

P60 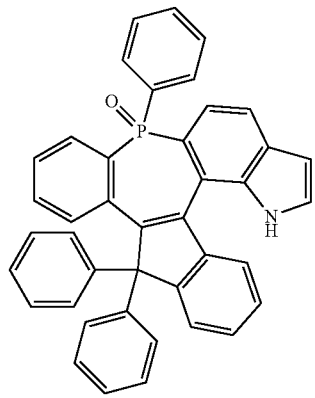
P61 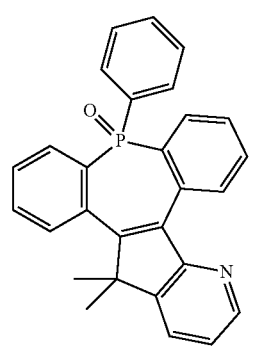
P62 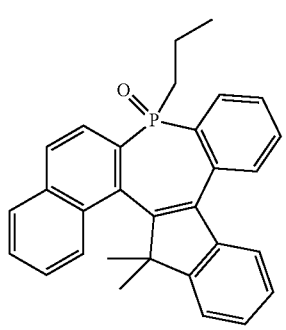
P63 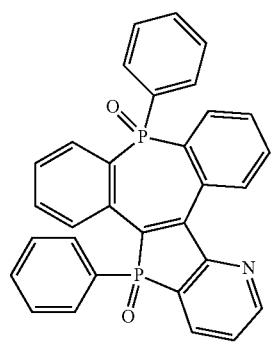
P64 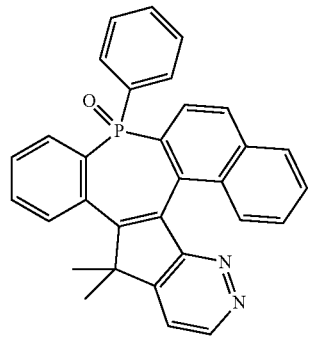
P65 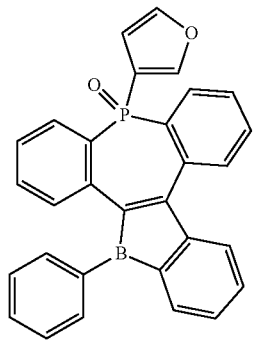
P66 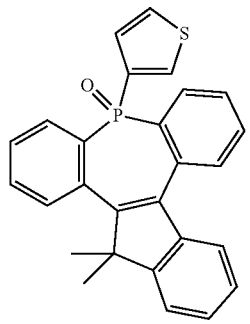
P67 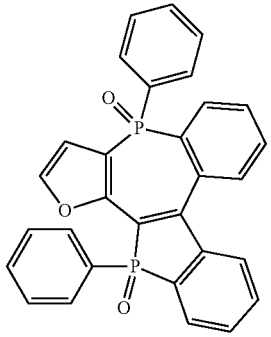

P68
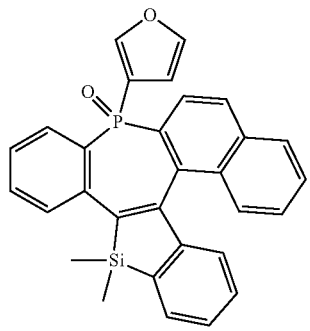
P69
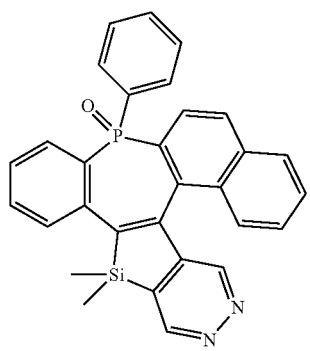
P70
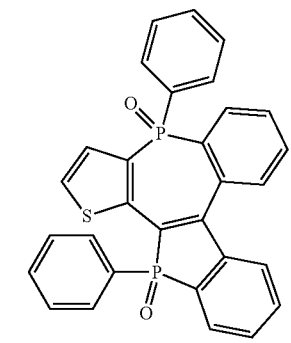
P71
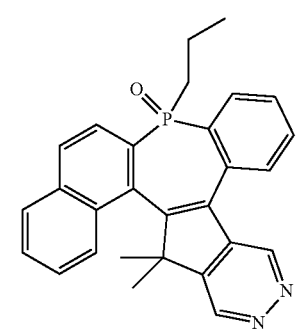
P72
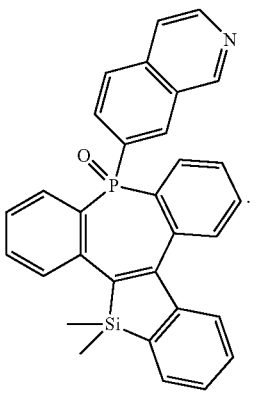
9. The compound according to claim 1, wherein the compound is selected from any one of
P01
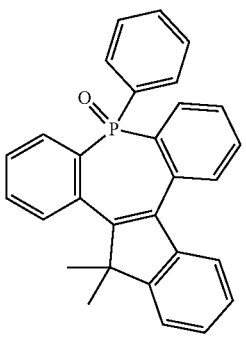
P02
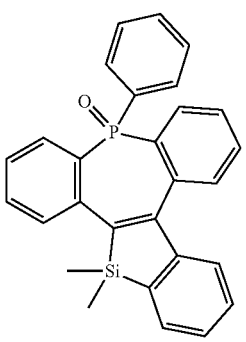
P03
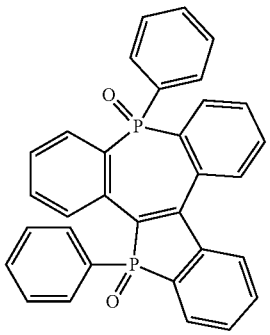

P05

P07

P09

P11

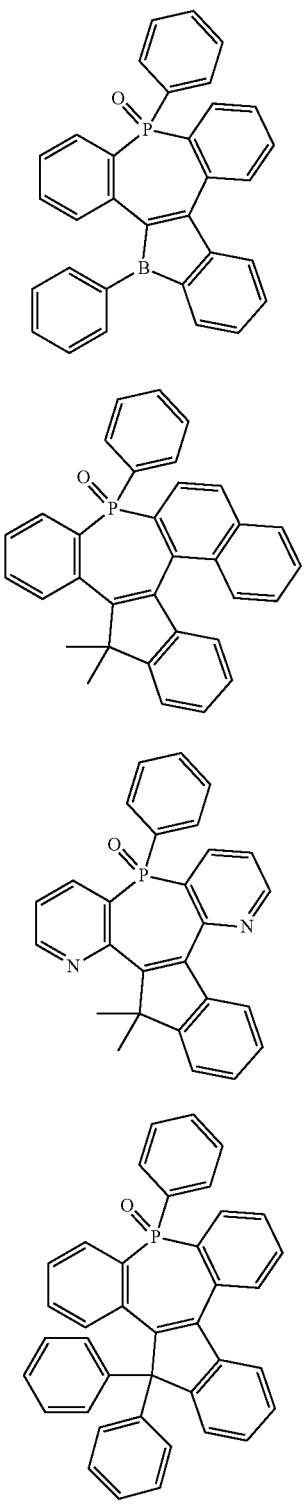

P59

P65

P70

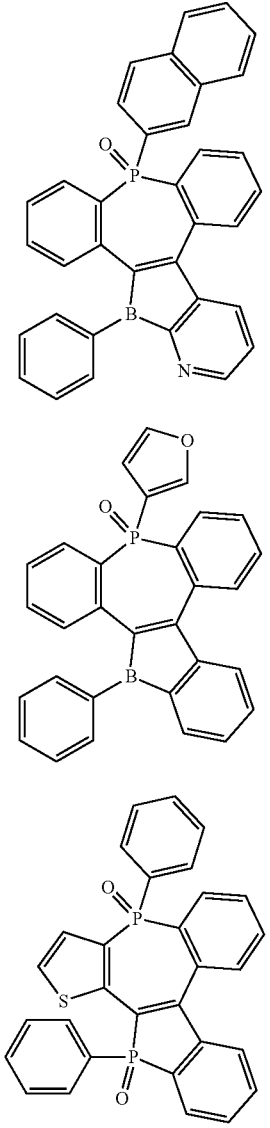

10. An organic electroluminescent device, comprising:
a first electrode and a second electrode, and an organic functional layer located between the first electrode and the second electrode, the organic function layer comprising an electron transport layer, wherein electron transport material of the electron transport layer comprises the compound according to claim 1.

11. The organic electroluminescent device according to claim 10, wherein the organic functional layer further comprises a hole blocking layer, and transport material of the hole blocking layer comprises the compound.

12. A display device, comprising the organic electroluminescent device according to claim 10.

* * * * *